US012792791B2

(12) United States Patent
Chandragiri

(10) Patent No.: US 12,792,791 B2
(45) Date of Patent: Nov. 10, 2026

(54) AUTOMATED ARCHITECTURAL DESIGN

(71) Applicant: AkersTek LLC, Pittsford, NY (US)

(72) Inventor: Devi Prasad Chandragiri, Pittsford, NY (US)

(73) Assignee: AkersTek LLC, Pittsford, NY (US)

( * ) Notice: Subject to any disclaimer, the term of this patent is extended or adjusted under 35 U.S.C. 154(b) by 1178 days.

(21) Appl. No.: 17/588,627

(22) Filed: Jan. 31, 2022

(65) Prior Publication Data

US 2023/0244827 A1 Aug. 3, 2023

(51) Int. Cl.
*G06F 30/13* (2020.01)
*G06F 30/27* (2020.01)

(52) U.S. Cl.
CPC .............. *G06F 30/13* (2020.01); *G06F 30/27* (2020.01)

(58) Field of Classification Search
CPC ................................. G06F 30/13; G06F 30/17
See application file for complete search history.

(56) References Cited

U.S. PATENT DOCUMENTS

| | | | | |
|---|---|---|---|---|
| 11,263,361 B1 * | 3/2022 | Soflin | H04L 67/1097 |
| 11,354,855 B2 * | 6/2022 | Ganihar | G06T 17/20 |
| 12,061,852 B2 * | 8/2024 | Suto | G06F 30/13 |
| 2008/0281561 A1 * | 11/2008 | Shulman | G06F 30/13 703/1 |
| 2017/0161404 A1 * | 6/2017 | High | G06F 30/13 |
| 2021/0192111 A1 * | 6/2021 | Hoyer | G06F 30/13 |
| 2021/0209261 A1 | 7/2021 | Reynolds et al. | |
| 2021/0397760 A1 * | 12/2021 | Whitney, Jr. | G06N 3/008 |
| 2022/0245743 A1 * | 8/2022 | Srinivasan | G06F 30/27 |
| 2022/0327264 A1 * | 10/2022 | Murphy | G06N 3/08 |
| 2023/0237795 A1 | 7/2023 | Niekerk et al. | |
| 2024/0169106 A1 * | 5/2024 | Johnson | G06Q 10/04 |

OTHER PUBLICATIONS

Yan, et al., "Practical Application of Artificial Intelligence in the Construction of Ancient Fengshui Buildings," J. Phys.: Conf. Ser. 1533 032099 (Year: 2020).*

* cited by examiner

*Primary Examiner* — Ryan F Pitaro
*Assistant Examiner* — Joseph P Morris
(74) *Attorney, Agent, or Firm* — Fish & Richardson P.C.

(57) ABSTRACT

The subject matter of this specification can be embodied in, among other things, a method that includes obtaining, by a first computing device, property characterization data for a first real property interest; applying the property characterization data to an architectural design compliance engine of the first computing device to obtain a first metric indicative of compliance of the first real property interest to an architectural design rule set; and generating, by the first computing device, a proposed re-design plan for the first real property interest associated with a second metric, in which the second metric is indicative of greater compliance with the architectural design rule set than the first metric.

16 Claims, 14 Drawing Sheets

AUTOMATED ARCHITECTURAL DESIGN

TECHNICAL FIELD

The present specification relates to automated architectural design.

BACKGROUND

Brief description of technical field. No more than a paragraph without denigrating the prior art or explaining that certain outcomes are desired.

SUMMARY

In general, in one or more aspects, the subject matter of the present specification can be embodied in methods that include: obtaining, by a first computing device, property characterization data for a first real property interest; applying the property characterization data to an architectural design compliance engine of the first computing device to obtain a first metric indicative of compliance of the first real property interest to an architectural design rule set; and generating, by the first computing device, a proposed re-design plan for the first real property interest associated with a second metric, in which the second metric is indicative of greater compliance with the architectural design rule set than the first metric.

Other embodiments of this aspect include corresponding computer systems, apparatus, and computer programs recorded on one or more computer storage devices, each configured to perform the actions of the methods.

The foregoing and other embodiments can each optionally include one or more of the following features, alone or in combination. In particular, one embodiment includes all the following features in combination. For example, in some implementations, the architectural design rule set is based on Vastu Shastra design principles or Feng Shui design principles.

In some implementations, the property characterization data comprises location characterization data that characterizes a location of the first real property interest. The location characterization data can include orientation data characterizing an orientation of the first real property interest relative to a fixed location point.

In some implementations, the property characterization data comprises neighborhood characterization data characterizing landscape features of an area in which the first real property interest is located. The neighborhood characterization data can include one or more of flora data characterizing arrangement of flora in a vicinity of the first real property interest, street data characterizing an arrangement of one or more streets in the vicinity of the first real property interest, and structural element data characterizing an arrangement of one or more building structures in the vicinity of the first real property interest.

In some implementations, the property characterization data comprises one or more images of the first real property.

In some implementations, applying the property characterization data to an architectural design compliance engine to obtain the first metric includes: parsing the property characterization data into a plurality of property categories; for each category of the plurality of categories, deriving a respective category rating by evaluating the category against a corresponding rule in the architectural design rule set to provide a plurality of category ratings; and deriving the first metric based on the plurality of category ratings. Parsing the property characterization data can include applying the property characterization data to a neural network to obtain the plurality of property categories. Parsing the property characterization data can include deriving an orientation of one or more features of the first real property.

In some implementations, generating, by the architectural design compliance engine, the proposed re-design plan for the first real property interest comprises modifying a layout of the first real property interest in accordance with the architectural design rule set. Modifying the layout of the first real property interest can include applying the property characterization data to a neural network to obtain the proposed re-design plan, wherein the neural network is trained to modify property design plans to have improved compliance with the architectural rule set. Modifying the layout of the first real property interest in accordance with the architectural design rule set can include changing a design size of a room of the first real property interest to increase a compliancy rating of the room with a corresponding rule in the architectural design rule set. Modifying the layout of the first real property interest in accordance with the architectural design rule set can include changing a design orientation of a room of the first real property interest to increase a compliancy rating of the room with a corresponding rule in the architectural design rule set. Modifying the layout of the first real property interest in accordance with the architectural design rule set can include changing a design location of a room of the first real property interest to increase a compliancy rating of the room with a corresponding rule in the architectural design rule set. Modifying the layout of the first real property interest in accordance with the architectural design rule set can include modifying a flora arrangement design of the first real property interest to increase a compliancy rating of the first real property with the architectural design rule set.

In some implementations, generating, by the architectural design compliance engine, the proposed re-design plan for the first real property interest comprises constructing a three-dimensional image of the proposed re-design plan.

In some implementations, generating, by the architectural design compliance engine, the proposed re-design plan for the first real property interest includes: applying a first weighting to a first compliancy rating associated with the proposed re-design plan to provide a first weighted compliancy rating; applying a second weighting to a second compliancy rating associated with the proposed re-design plan to provide a second weighted compliancy rating, wherein the second weighting is different from the first weighting, and wherein the first weighting and the second weighting are defined in accordance with the architectural design rule set; and deriving the second metric based on the first compliancy rating and the second compliancy rating.

In general, in another aspect, the subject matter of the present disclosure can be embodied in methods that include: obtaining, by a first computing device, property records for a first real property interest, in which the property records comprise location characterization data that characterizes a location of the first real property interest, neighborhood characterization data characterizing landscape features of an area in which the first real property interest is located, floor layout data characterizing a floorplan layout of the first real property interest; generating, by the first computing device and from the property records, a plurality of property category entries for a plurality of property categories, respectively; deriving, by the first computing device and based on the plurality of property category entries, a first metric indicative of compliance of the first real property interest to an architectural design rule set; generating, by the first computing device, a proposed re-design plan for the first real property interest, in which generating the proposed re-design plan comprises transforming the floorplan layout of the first real property interest so that the proposed re-design plan has a second metric indicative of greater compliance with the architectural design rule set than the first metric; and generating an interactive report that displays the proposed re-design plan.

Other embodiments of this aspect include corresponding computer systems, apparatus, and computer programs recorded on one or more computer storage devices, each configured to perform the actions of the methods.

The details of one or more embodiments of the subject matter of this specification are set forth in the accompanying drawings and the description below. Other features, aspects, and advantages of the subject matter will become apparent from the description, the drawings, and the claims.

DETAILED DESCRIPTION

Figure 1:
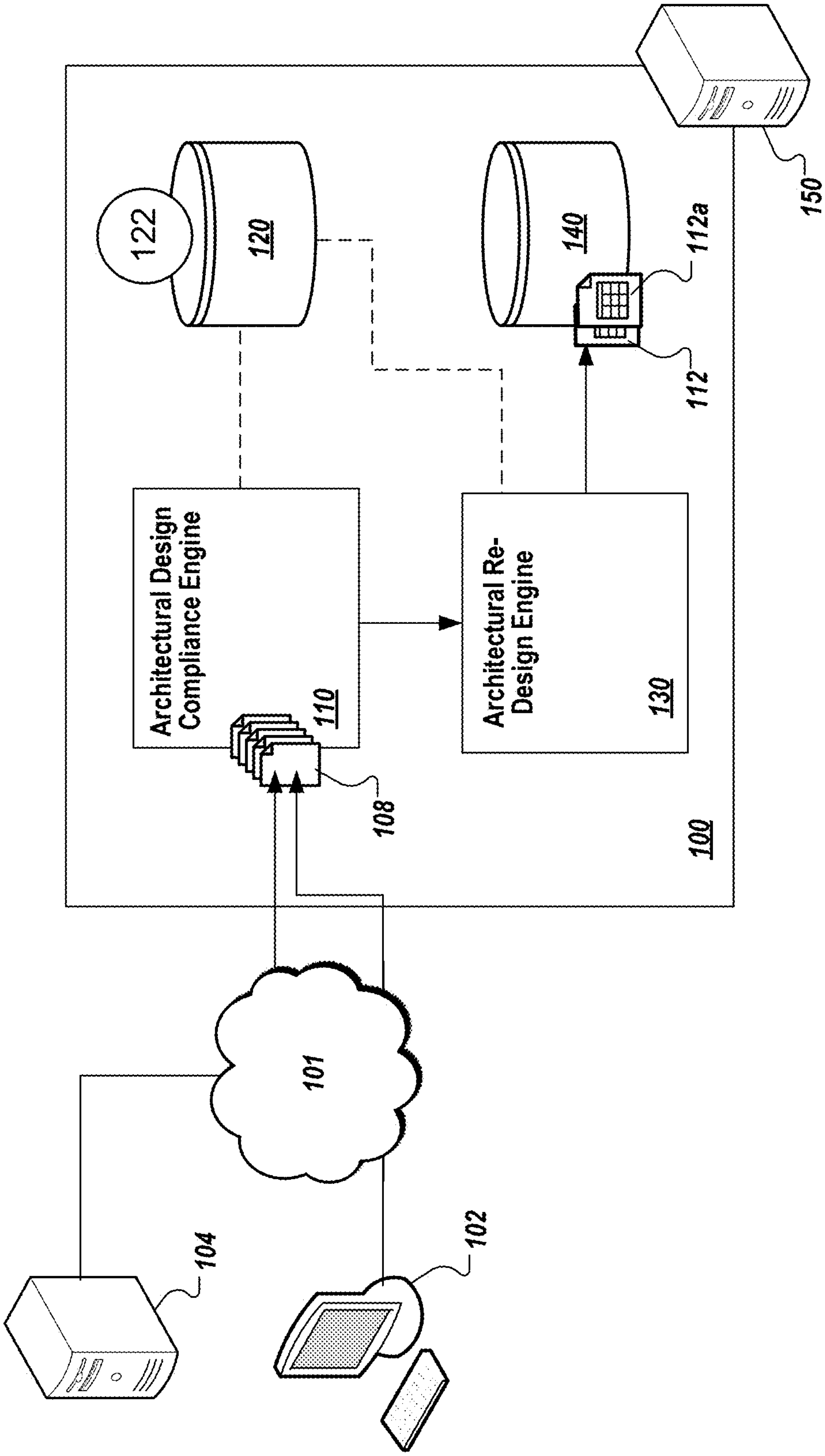
FIG. 1 is a schematic that illustrates an example of an architectural design system according to the present disclosure.

The present specification describes systems and techniques for extracting real property characteristics from various data sources, and assembling the extracted real property characteristics into structured data formats to facilitate analysis of how the real property complies with an architectural design rule set, including rule sets based on spiritual practice. Moreover, the present specification covers systems and techniques for automatically generating re-design plans that modify the layout of the real property to enhance the compliance of the real property with the architectural design rule set. In particular implementations, the architectural design rule sets are based on principles of Vastu Shastra or Feng Shui.

When purchasing or renting a home, there are various customary factors that are readily available for a new home buyer/renter to consider in making a decision. These factors include, e.g., purchase/rental price, location of the home relative to mass transit, the school district in which the home is located, the size of the home, the number of bedrooms, etc. These features tend to be single valued or binary (yes or no) characteristics that a new home buyer/renter evaluates when making a purchasing decision. However, for home buyers/renters who look to a home's compliance with their spiritual practice, there tends to be a dearth of information readily available and in the proper format to assist the purchaser with their decision making process. For instance, readily available property information does not tend to include orientation of the property itself or of its rooms relative to a particular geographic direction. Or how the arrangement of the rooms (e.g., kitchen, bedroom, living room) relative to one another enhances or detracts from the purchaser's spiritual well-being in accordance with their philosophical practice. Nor is it easy to objectively evaluate, based on available property information, how well each room, let alone the property as a whole, complies with the principles of the philosophies practiced by the purchaser. While a purchaser can evaluate such compliance with their favored spiritual practice, this tends to be a time-intensive process (e.g., requiring on-site visits to the property and/or dependent on the availability of blue prints for the home) and also subjective, as it can depend on the limited understanding of the person evaluating the real property.

The present disclosure is directed to systems and techniques for automatically generating property design plans that comply with general guidelines of specified philosophical practices and that previously only could be produced by subjective human analysis. The present disclosure covers particular implementations for establishing a structured process that can be employed by systems not only to evaluate a home's compliance with the purchaser's spiritual practice, but also to generate a re-design plan that improves such compliance.

Feng shui is the Chinese practice in which a structure and/or location is arranged so as to harmonize with the spiritual forces that are believed to inhabit it. Feng shui can apply to the arrangement of rooms within a home, of furniture and structures within a room, as well as to the layout of the natural environment in and around a structure. There are various forms or branches of Feng Shui, each of which may be based on or derived from several foundational concepts, including qi (a movable positive or negative force), polarity, and bagua (essentially an energy map divided into areas representing different life circumstances). Each of the bagua areas can be associated with shapes, colors, seasons, numbers and elements (e.g., wood, fire, earth, water, and metal) that are believed to correspond to a particular life circumstance. For instance, each different bagua may be associated with family, wealth, health, knowledge, benefactors, children, reputation, life path, and partnerships. Thus, by moving the locations of rooms, changing a room's (or home's) orientation relative to a geographic direction, and modifying a room's shape, among other changes, it is possible to increase the energy or improve flow in one's home consistent with the principles of Feng Shui.

Vastu Shastra is a traditional Indian system of architecture. Vastu Shastra incorporates traditional Hindu and (in some cases) Buddhist beliefs, and aims to integrate architecture with nature, the relative functions of various parts of the structure, and ancient beliefs utilizing geometric patterns (yantra), symmetry, and directional alignments. Vastu Shastra covers a collection of ideas and concepts for organizing space and form within a building or a collection of buildings, based on their functions in relation to each other and their usage, and is not typically rigid in its application. Depending on the orientation, shape, function, and/or location, rooms may be understood to be associated with greater or less energy.

Both practices of Feng Shui and Vastu Shastra focus on the center of the home as the location where the energies of the home combine. Additionally, both Feng Shui and Vastu Shastra rely on compass directions for evaluating the positive or negative energy associated with placement of objects within the home and the architecture including layout of rooms. However, there is no one generally authoritative correct way to evaluate or to re-order one's home to comply with Feng Shui or Vastu Shastra.

FIG. 1 is a schematic that illustrates an example of an architectural design system 100 that is configured to evaluate compliance of a first real property interest with an architectural design rule set, and/or to generate, based on data characterizing the first real property interest (e.g., property characterization data 108), a proposed re-design plan that improves the compliance of the first real property interest with the architectural design rule set. The architectural design system 100 generally includes at least one computing system that is configured to obtain, via a network 101, data 108 characterizing real property interests including, e.g., records and files of the real property interests, as well as user data entered through interactive user interfaces.

For example, in some implementations, the data 108 characterizing the real property interests can be obtained from one or more client devices 102. The one or more client devices 102 can include one or more computer systems configured to send data 108 characterizing the real property interests to the architectural design system 100 over a network 101 (e.g., the Internet). The one or more client devices 102 can be configured to present a user interface to a user through which the user can enter data about real property interests. The one or more client devices 102 can be configured to execute an application that generates and presents the user interface on the one or more client devices. Alternatively or in addition, the one or more client devices 102 can be used to operate a web browser that presents a user interface through a web page hosted by the architectural design system 100 or by another computing system.

Alternatively or in addition, in some implementations, the data 108 characterizing the real property interests can be obtained from third party providers, such as real estate multiple listing services (mls), postal services (e.g., United States Postal Service), third party databases and search sites (e.g., Corelogic®, Zoopla®, and Eagleview®), or other public and/or private sources that support databases containing information about real property interests. The data from the third party providers can be obtained over the network 101 from one or more servers 104 operated by the third party providers.

In some implementations, the property characterization data 108 can include location characterization data. Location characterization data can include, e.g., the address of the real property interest, global positioning system coordinates of the real property interest, orientation data about the real property interest that characterizes an orientation of the real property interest relative to a fixed location point or direction (e.g., to which cardinal and/or ordinal direction a front, rear and/or side of a property is facing, and/or how different levels, floors and/or rooms of the property are arranged relative to a cardinal and/or ordinal direction), actual location (eg., is the land in the SW corner of the neighborhood, is the house in the NE corner of the land, etc.,) at which the reale property is located relative to over real property among other features.

Alternatively or in addition, in some implementations, the property characterization data 108 can include neighborhood characterization data characterizing landscape features of an area in which the first real property is located. For example, the neighborhood characterization data comprises one or more of flora data characterizing arrangement of flora (e.g., trees, bushes, lawns, hills, land scape slope etc.) in a vicinity of and/or relative to the real property interest, street data characterizing an arrangement of one or more streets in the vicinity of and/or relative to the real property interest, and structural element data characterizing an arrangement of one or more structures (e.g., pool, shed, driveway, fence, a neighbor's home/apartment, other buildings, etc.) in the vicinity of and/or relative to the real property interest.

Alternatively or in addition, in some implementations, the property characterization data 108 includes how rooms are arranged in the real property interest. For example, the property characterization data can include information about where rooms on a first floor of the real property interest are located and where rooms on other floors of the real property interest are located. For instance, the information about where rooms are located can include information as to whether a room is in a north, northeast, east, southeast, south, southwest, west, or northwest corner or side of a building. The information about where the rooms are located can include, e.g., information about which rooms are directly adjacent to the room and in what direction the adjacent rooms are located. The information about the rooms can include whether the rooms are offices, living rooms, dining rooms, dens, kitchens, family rooms, washrooms, bedrooms, bathrooms, game rooms, hallways, or closets, and can include whether the rooms include doorways and where the doorways are located in the rooms, and can include information about objects within the rooms such as, e.g., the location of stoves, sinks, toilets, windows, vents, heaters, light fixtures, electrical outlets, among other features.

In some implementations, the property characterization data 108 can be contained in documents as written text/prose that can be parsed and/or read using optical character recognition, text recognition algorithms, and/or machine learning systems. For instance, the documents can be standard forms used in real estate transactions, used by real estate professionals, and/or government documents. Alternatively or in addition, the property characterization data can be contained in documents as images. For instance, the property characterization data 108 can include one or more images of the property of interest, such as a street view image, a satellite image, and/or photographs of a building interior of the real property interest.

In some implementations, the property characterization data 108 obtained by the system 100 is provided to an architectural compliance engine 110. The architectural compliance engine 110 analyzes the property characterization data 108 to obtain a first metric indicative of compliance of the first real property interest with an architectural design rule set. For example, in some implementations, the architectural compliance engine 110 parses the property characterization data 108 to extract information about the real property interest. For example, in some implementations, the architectural compliance engine 110 performs text recognition on the property characterization data 108. The text recognition can be performed on standardized documents to extract data from pre-defined fields. Alternatively, or in addition, the architectural compliance engine 110 performs optical character recognition on the property characterization data 108, followed by applying a text recognition algorithm to extract the information about the real property interest. In some implementations, the architectural compliance engine 110 includes a machine learning system trained to recognize and extract text from documents in the property characterization data 108. The extracted information then can be arranged and categorized for analysis by the architectural design compliance engine 110 against one or more architectural design rule sets.

In some implementations, the architectural compliance engine 110 performs image recognition on the property characterization data 108 to extract information about the real property interest. For example, the architectural compliance engine 110 can employ machine learning to determine and identify: structures in or around the real property interest; the boundaries of structures in or around the real property interest; individual rooms, including the size and/or type of room (e.g., whether the room is used as a bedroom, kitchen, or bathroom); and/or the orientation of objects in the images relative to a fixed location point or direction, among other features that can be identified through image recognition.

A rules database 120 stores one or more different architectural design rule sets 122. The one or more different architectural design rule sets can be accessed by the design compliance engine 110. An architectural design rule set 122 sets forth specific rules, parameters and/or weights to characterize compliance with a specified architectural design philosophy. The design rule set 122 can be applied by the architectural compliance engine 110 to the extracted property characterization data for the real property interest to generate a compliance metric indicative of how closely the real property interest follows the architectural design philosophy. In some implementations, the architectural design compliance engine 110 (and/or the architectural re-design engine 130) can arrange the extracted property characterization data into general categories and/or subcategories, each of which is analyzed to derive a corresponding compliance metric. For instance, the architectural design compliance engine 110 can arrange the extracted property characterization data into general categories representing the exterior and interior areas of a real property interest. Alternatively, or in addition, the architectural design compliance engine 110 can arrange the extracted property characterization data into general categories representing different floors of the real property interest. In some implementations, the architectural design compliance engine 110 (and/or the architectural re-design engine 130) can further break down the general categories into sub-categories, e.g., by room (e.g., a first room sub-category of the first floor category, a second room sub-category of the first floor category, . . . a first room sub-category of the second floor category, etc.). For instance, as just one example, a rule that favors are particular arrangement/location of a room can stipulate that a compliance metric associated with that room should be assigned a particular value when the room location/arrangement complies with the rule and should be assigned a different value (e.g., a lesser value) when the room arrangement/location does not comply with the rule. Other algorithms for assigning values to the compliance metric can also be applied. For instance, in some cases, certain categories that are considered more important in terms of compliance with the rule set can have their compliance metrics weighted differently from categories that are considered to be of lesser importance as far as compliance with the rule set. In some instances, an overall compliance metric for the real property interest can be obtained by summing or averaging (e.g., by obtaining a weighted sum or weighted average) the compliance metric for each general category and/or subcategory. Thus, rather than a user having to perform a subjective evaluation of the real property interest, the system 100 is capable of providing automation of specific tasks for evaluating how closely a real property interest follows the architectural design philosophy. As explained herein, the architectural design rule sets can be based, e.g., on Vastu Shastra design principles or Feng Shui design principles.

To improve compliance with the architectural design philosophy, the extracted property characterization data can be passed to the architectural re-design engine 130. The architectural re-design engine 130 can generate a proposed re-design plan 112 for the real property interest. The architectural re-design engine 130 can generate the re-design plan 112 to have greater compliance with the one or more architectural design rule sets 122. For example, the proposed re-design plan for the first real property interest can include modifying a layout of the real property interest in accordance with the architectural design rule set so that the compliance is improved. The architectural re-design engine 130 (and/or the architectural design compliance engine 110) can derive a second metric that is indicative of the proposed re-design plan's compliance with the one or more architectural design rule sets, in which the second metric is indicative of the greater compliance with design rule sets than the first metric.

Modifying the layout of the real property interest in accordance with the architectural design rule set can include making design changes to the real property interest to increase a compliancy rating with a corresponding rule in the architectural design rule set, e.g.: changing a designed size of a room of the real property interest; changing a location of a door within a room; changing a location of a window within a room; changing a room type (e.g., changing any of a dining room, living room, den, family room, kitchen, bathroom, hallway, bedroom, playroom, washroom, to any other type of room); changing a location and the direction (face north side instead of west side etc. . . . ,) of an object within a room or moving the object to another room (e.g., changing a location of a bed, a couch, a plant, a mirror, a television, a desk, an oven/stove/fire place, a sewer outlet, a dishwasher, a washing machine, a dryer, a sink, fan, a dresser, a table, etc.); and adding or removing structures to the real property interest (e.g., adding or removing flora in the vicinity of the real property interest, a load bearing wall/pillar, a staircase, a type of staircase, a shed, a guest house, a barn, a lake, a canal, a water body, rock, hill, back fill pool).

The architectural re-design engine 130 can determine what changes should be made to the real property interest by evaluating options for how and whether changes to the real property interest in the one or more categories can increase compliance with a corresponding rule in the architectural design rule set. In an example, the architectural re-design engine 130 (and/or the architectural design compliance engine 110) can arrange the extracted property characterization data into general categories representing different floors of the real property interest (e.g., a first floor category and a second floor category). The architectural re-design engine 130 (and/or the architectural design compliance engine 110) can further break down the general categories into sub-categories, e.g., by room (e.g., a first room sub-category of the first floor category, a second room sub-category of the first floor category, . . . a first room sub-category of the second floor category, etc.). For each category and/or for each sub-category, the architectural re-design engine 130 can iterate through various modifications to identify modifications that increase compliance with a corresponding rule in the architectural design rule set.

For example, in some implementations, the architectural re-design engine 130 can evaluate the extracted property characterization data against a rule within a rule set based on Feng Shui that favors a master bedroom located in the back of the home in the south, southwest corner, north, or northeast corner over a master bedroom located in the west, northwest, east, or southeast corner. For instance, if a present location of the master bedroom from the extracted property characterization data is already in one of the favored locations, then the architectural re-design engine 130 does not recommend a change. However, if the present location of the bedroom is in one of the lesser favored locations, the architectural re-design engine 130 can recommend changing the design of the room to increase the compliance metric associated with the room. For example, the architectural re-design engine 130 can propose changing the room type designation from a master bedroom to another room type associated with a higher compliance metric (e.g., a guest bedroom).

Alternatively, or in addition to changing the type of room to increase the compliance rating of the room with the architectural design rule set, the architectural re-design engine 130 can suggest a more substantial modification, such as changing the size of the room, changing a location of a doorway within the room, changing a location of a window within the room, changing a location of an object within the room. Since, in some implementations, modifying the size and/or shape of a room is prohibited for structural reasons and/or because of excessive cost associated with such a change, the architectural re-design engine 130 can be configured to disfavor or preclude those suggested modifications. For instance, in some implementations, a proposed change that entails making a structural modification to the room or other part of the real property can be weighted so it is disfavored relative to a modification that does not entail a structural modification. In a particular example, the architectural re-design engine 130 may evaluate several different changes to the room from substantial structural modifications (e.g., removing a wall, moving a door, moving a window) to less substantial modifications (e.g., moving furniture) and obtain a corresponding compliance metric for each proposed change. For proposed changes associated with less substantial modifications, the obtained compliance metric can be weighted to have a higher value. Alternatively, or in addition, the obtained compliance metric for substantial modifications can be weighted to have a lower value. In some implementations, the architectural re-design engine 130 can be configured so that a user of the architectural re-design engine 130 can select whether the re-design engine 130 suggests structural modifications. For instance, the architectural re-design engine 130 can be configured to provide a user a selectable option to prohibit or allow the engine 130 from providing structural design changes in addition to non-structural design changes.

Alternatively, or in addition, the architectural re-design engine 130 can determine, based on the extracted property characterization data, what types of modifications are prohibited. For example, in some implementations, the extracted property characterization data can include information about where load-bearing structures within the real property interest are located. Based on this received information, the architectural re-design engine 130 can set a parameter prohibiting room size/shape changes that would cause the load bearing structure to be removed or to be located in non-preferred positions (e.g., in the center of a room). During the re-design phase, the architectural re-design engine 130 can then perform a check whether a suggested modification violates the parameter and then can exclude the suggested modification if it is found to violate the parameter.

The architectural re-design engine 130 can cycle through each sub-category within a category, suggesting a proposed modification for the sub-category and/or category (if needed) until all categories and sub-categories have been analyzed by the architectural re-design engine 130. In some implementations, after analysis for a first category or sub-category is completed, the architectural re-design engine 130 can restrict that category from further editing. Alternatively or in addition, the re-design engine 130 can restrict certain features or aspects from being used again. For example, if a room type is changed by the architectural re-design engine 130 from a guest bedroom to a master bedroom, use of the master bedroom type can be eliminated from the list of possible types that a room can be designated.

In some implementations, the order in which the architectural re-design engine 130 cycles through the categories and/or the sub-categories can be random. In other implementations, the order in which the architectural re-design engine 130 cycles through the categories and/or the sub-categories and performs the analysis and re-design can be predetermined based on those categories and/or sub-categories deemed most important. For example, room category priority may designate the rooms in order of decreasing priority from kitchen to dining room to master bedroom, such that the kitchen would be designated as the first room to analyze using the re-design engine 130, followed by the dining room and then the master bedroom. In another example, the first floor of a property may be designated as the first category to analyze, such that all rooms on the first floor are analyzed first before any rooms on the second floor are analyzed by the re-design engine 130.

In some implementations, the architectural re-design engine 130 can include a neural network trained to modify property design plans to improve compliance with the defined architectural rule set. For instance, the neural network can be trained on existing real property layouts that are associated with metrics indicative of high compliance with a predefined architectural rule set. The training data can be stored, e.g., in database 120 and accessed by the re-design engine 130 (and/or the compliance engine 110). The neural network can be trained to propose modifications to the sub-categories and categories that result in an increase in the compliance metric associated with the sub-categories and categories.

As explained herein, during the re-design process, and/or after the re-design process has been completed, the proposed re-design plan 112 can include a new metric **112*a* indicative of compliance of the real property re-design with the architectural design rule set is derived. Such a new metric 112*a* can be derived by combining (e.g., by averaging or summing) the compliance value derived for each sub-category and/or category into a total compliance value. The new compliance metric 112*a* can be stored in compliance database 140**.

The architectural design compliance engine 110 and the architectural re-design engine 130 can be implemented on one or more processors, e.g., distributed across multiple computing systems 150. Each of the rules database 120 and the compliance database 140 can be stored on the same computing system as the processor(s) implementing the engines 110, 130, or can be stored on one or multiple different computing systems. In the example of FIG. 1, the databases 120, 140 are stored on the same computing systems 150 as the engines 110, 130.

Figure 2A:
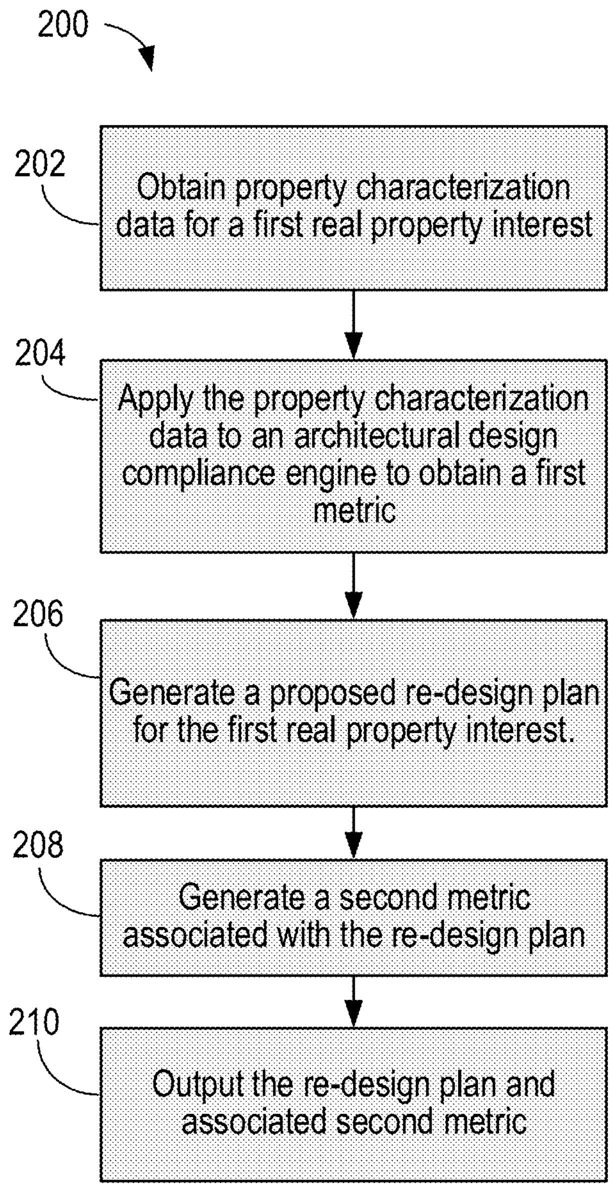
FIG. 2A is a flow chart that shows an example of a process for generating a re-design plan for a real property interest.

FIG. 2 is a flow chart that shows an example of a process 200 for generating a re-design plan for a real property interest and deriving an associated compliance metric for the re-design plan that indicates a level of compliance with an architectural rule set. The process 200 and variations thereof may be performed, for example, by a system such as the system 100 shown in FIG. 1. For clarity of presentation, the description that follows uses the system 100 as an example for describing the process 200 and variations thereof. However, another system, or combination of systems, may be used to perform the processes.

Property characterization data for a first real property interest is obtained (202). The first real property interest can be any type of real property interest, such as, e.g., a residential building, office building, or land. As explained herein, the property characterization data can include location characterization data, neighborhood characterization data, and data characterizing how a structure of the real property interest is arranged (e.g., how rooms within the real property interest are arranged).

In some examples, the property characterization data is obtained from third party provider databases, such as real estate mls databases, postal service databases, or other public and/or private sources that support databases containing information about real property interests. The data from the third party providers can be obtained over a network such as the Internet.

In some examples, a user directly provides the property characterization data to the system. For example, a user can upload imagery of the real property interest to the system. In some examples, a user can upload specific details about the real property interest including, e.g., location of the real property interest, type of the real property interest (such as residential property (e.g., including whether the property includes an apartment, a condominium, a single family home, etc.) or a business property), the size of the real property interest, the relative orientation of the real property interest, and other features characterizing the real property interest.

The property characterization data is provided (204) to an architectural design compliance engine (e.g., engine 110). The architectural compliance engine analyzes the property characterization data 108 to obtain a first metric indicative of compliance of the first real property interest with an architectural design rule set. For example, in some implementations, the architectural compliance engine parses the property characterization data to extract information about the real property interest. This can include performing text recognition on the property characterization data, performing optical character recognition on the property characterization data, performing image recognition on the property characterization data, and/or applying a machine earning algorithm to recognize and extract text from documents in the property characterization data.

The extracted information is arranged and categorized for analysis by the architectural design compliance engine against one or more architectural design rule sets. As explained herein, the architectural design rule set can include a set of design rules, parameters, and/or weights that are used by the system to determine how closely the real property interest complies with a defined architectural design philosophy. The architectural design compliance engine can arrange the extracted property characterization data into general categories and/or subcategories, each of which is analyzed with respect to the architectural design rule set to derive a corresponding compliance metric. The architectural design compliance engine can score each general category and/or each subcategory based on the parameters and weights set forth in the architectural design rule set. In some cases a cumulative score for the real property interest can be generated by the architectural design compliance engine. For instance, a cumulative score can be generated by summing the scores for the general categories and/or subcategories, or by averaging the scores for the general categories and/or subcategories.

In some examples, the metric (or metrics) obtained by the architectural design compliance engine can be provided as an output from the system to a user. For instance, the system can output the obtained metric (or metrics) to a display for analysis by a user. Alternatively, or in addition, the metric can be uploaded to and indexed in a database that stores compliance metrics for multiple real property interests.

The compliance metric can be presented as a value relative to an ideal value, e.g., as a percentage indicative of how well the real property interest satisfies the architectural design rule set. In some examples, the compliance metric can include an overall value characterizing the real property interest as a whole. The compliance metric can further include one or more additional values characterizing sub-levels of the real property interest, such as a metric indicative of how well the external features of the real property interest comply with the architectural design rule set, how well each floor of the real property interest complies with the architectural design rule set, and/or how well each room of the real property interest complies with the architectural design rule set.

In some examples, the system can output (e.g., output to a display, output to an email or test message communication, and/or output to memory within the system) a recommendation along with the compliance metric. For instance, the output can include one or more recommendations to alter, introduce, and/or remove: trees, bushes, plants, gardens, walkways, patios, decks, stones/rocks, yards, sheds, fences, driveways, walkways, pools, courts, outdoor lighting, entryways, hallways, dining rooms, living rooms, family rooms, office rooms, bathrooms, washrooms, kitchens, basements, attics, stairways, bedrooms, tables, chairs, stoves, ovens, refrigerators, dishwashers, closets, bookshelves, paintings, fireplaces, beds, desks, etc. The one or more recommendations can be provided as suggestions that will improve the compliance metric (or metrics) and can include a projected compliance score that takes into account the recommendation.

In some examples, the system can generate a proposed re-design plan for the real property interest (206). Generating the proposed re-design plan can include generating the aforementioned recommendation. Generating the proposed re-design plan can be performed by the architectural re-design engine 130.

The architectural re-design engine 130 can generate the re-design plan to have greater compliance with the one or more architectural design rule sets. For example, the proposed re-design plan for the real property interest can include modifying a layout of the real property interest in accordance with the architectural design rule set so that the compliance is improved.

In some implementations, modifying the layout of the real property interest in accordance with the architectural design rule set can include making design changes to the real property interest to increase compliancy with a corresponding rule in the architectural design rule set, e.g.: changing a type of room of the real property interst (e.g., changing a kitchen to a dining room); changing a designed size of a room of the real property interest; changing a location of a door within a room; changing a location of a window within a room; changing a room type (e.g., changing any of a dining room, living room, den, family room, kitchen, bathroom, hallway, bedroom, playroom, washroom, to any other type of room); changing a location of an object within a room or moving the object to another room (e.g., changing a location of a bed, a couch, a plant, a mirror, a television, a desk, an oven/stove, a dishwasher, a washing machine, a dryer, a sink, fan, a dresser, a table, etc.); and adding or removing structures to the real property interest (e.g., adding or removing flora in the vicinity of the real property interest).

Generating the re-design plan can include applying a trained neural network, (or other type of machine learning model, though the phrase "neural network" will be used herein to refer to any applicable machine learning model) to the real property interest to produce the modified layout that is associated with greater compliance with the defined architectural rule set. Neural networks are machine learning models that employ multiple layers of operations to predict one or more outputs from one or more inputs. Neural networks typically include one or more hidden layers situated between an input layer and an output layer. The output of each layer is used as input to another layer in the network, e.g., the next hidden layer or the output layer.

Each layer of a neural network specifies one or more transformation operations to be performed on inputs to the layer. Some neural network layers have operations that are referred to as neurons. Each neuron receives one or more inputs and generates an output that is received by another neural network layer. Often, each neuron receives inputs from other neurons, and each neuron provides an output to one or more other neurons.

An architecture of a neural network specifies what layers are included in the network and their properties, as well as how the neurons of each layer of the network are connected. In other words, the architecture specifies which layers provide their output as input to which other layers and how the output is provided.

The transformation operations of each layer are performed by computers having installed software modules that implement the transformation operations, such as the computers disclosed herein. Thus, a layer being described as performing operations means that the computers implementing the transformation operations of the layer perform the operations.

Each layer generates one or more outputs using the current values of a set of parameters for the layer. Training the neural network thus involves continually performing a forward pass on the input, computing gradient values, and updating the current values for the set of parameters for each layer using the computed gradient values, e.g. using gradient descent. Once a neural network is trained, the final set of parameter values can be used to make predictions in a production system.

Figure 2B:
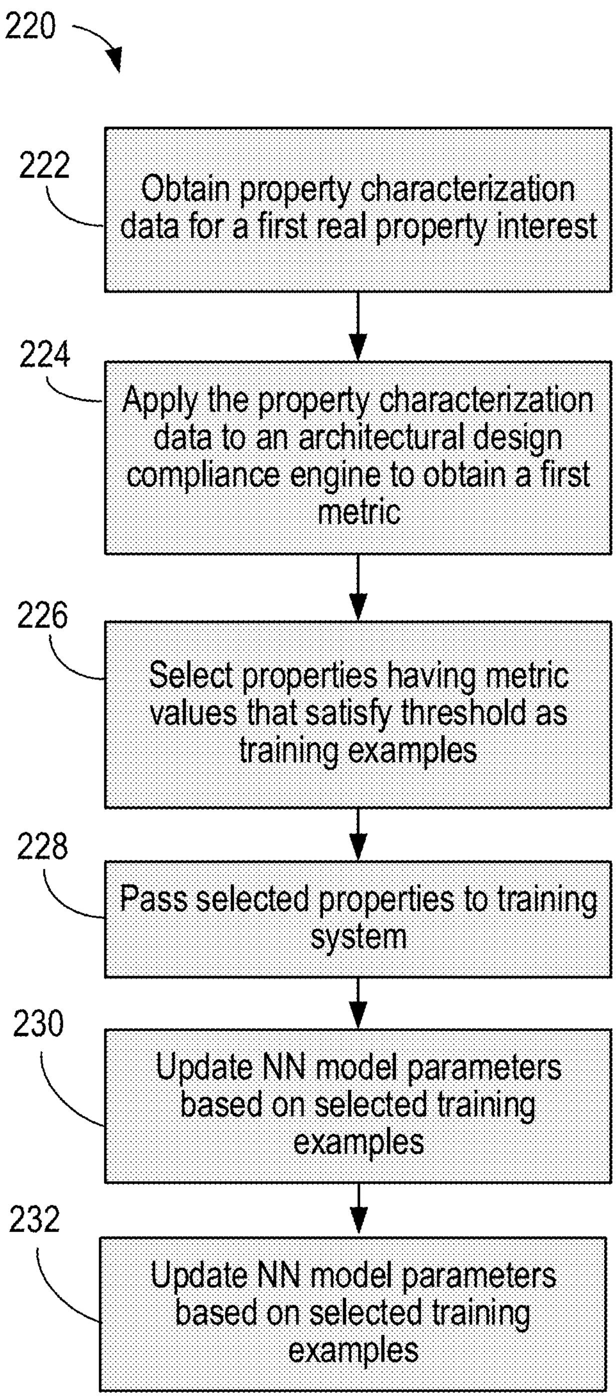
FIG. 2B is a flow chart that shows an example of a process for training a neural network.
Figure 2C:
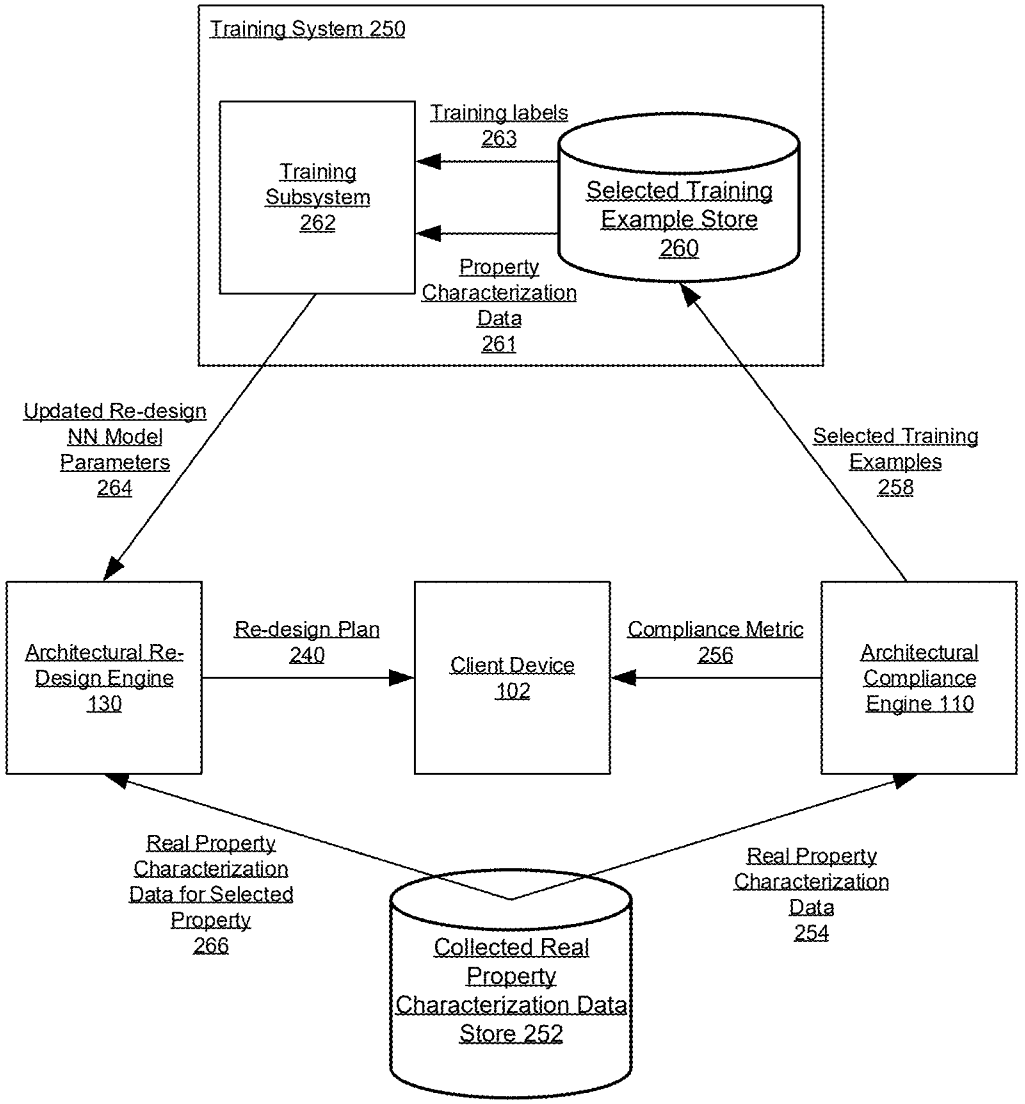
FIG. 2C is a schematic that illustrates an example of a neural network training system.

As an example, generating the re-design plan (206) can include training the neural network on existing real property layouts that are pre-associated with metrics indicative of high compliance with a predefined architectural rule set. An example process 220 for training the neural network is shown in FIG. 2B. An example of a neural network training system 250 is shown in FIG. 2C. Though shown separately in FIG. 2C, the training system 250 can be part of the architectural design compliance engine 110 and/or the architectural re-design engine 130. Alternatively, the training system 250 can be a distributed computing system having several, tens, or hundreds of computers in one or more locations. In some implementations, the architectural design system 100 itself can produce the training examples for the training system 250.

Referring to process 220 of FIG. 2B and the system shown in FIG. 2C, training a neural network model according to the present disclosure can include obtaining (222) collected real property characterization data for multiple real property interests. The collected real property characterization data 254 can include property characterization data 108 that is obtained as described herein and can be stored in a data store 252 (e.g., at a single site or distributed across multiple sites) in the system 100. The collected property characterization data 254 then can be applied (224) to the architectural design compliance engine 110 to obtain a corresponding compliance metric for each real property interest, where the compliance metrics are indicative of how closely the real property interests follow a specified architectural design philosophy. If a user is interested in a particular real property interest and submits a request to the system 100 for the compliance metric, the architectural compliance engine 110 can output the compliance metric 256 for that property interest to the client device 102. As explained herein, the compliance metric 254 can include a single metric for the entire selected real property interest or can include multiple metrics, each of which reflects a compliance of a component (e.g., exterior, interior, floor level, room, etc.) of the real property interest.

The architectural design system can be programmed to analyze property characterization data for a large number (e.g., 100, 1000, 10,000, or more) of properties to obtain metrics of compliance with an architectural design rule set for the properties, respectively. The system (e.g., the architectural compliance engine 110 as shown in FIG. 2C) then can select (226) properties having metric values (e.g., overall compliance metrics) that satisfy some pre-defined threshold indicative of a desired compliance with the architectural design rule set as the training examples 258. As a non-limiting example, a collection of properties may be analyzed by the system resulting in compliance metrics ranging in values between 1-100, with 1 corresponding to lowest compliance and 100 corresponding to highest compliance. The system (e.g., engine 110) can be configured to select those properties with compliance metrics (e.g., overall compliance metrics) having values above a pre-defined threshold, such as 80, 85, or 90 as the training data for the neural network. The selected properties meeting the defined threshold then can be passed (228) to the training system 250. The selected training examples 258 can be saved in a selected training example store 260 (e.g., at a single site or distributed across multiple sites). The saved training examples can include the property characterization data as well as the compliance metrics (e.g., overall compliance metric, floor-level compliance metric, room-level compliance metric, etc.) for each real property interest.

The training sub-system 262 uses the training examples from the training example store 260 to update (230) model parameters that will be used by the architectural re-design engine 130, and provides the updated model parameters 264 to the engine 130. Once the model parameters of the re-design engine 130 have been fully trained, the training system 250 can send (232) the trained neural network (NN) parameter values 264 to the re-design engine 130, e.g., through a wired or wireless connection.

For example, in some implementations, the training subsystem 262 obtains property characterization data 261 and a training labels 263 corresponding to the property characterization data and uses them to derive the neural network model parameters. Training labels 263 can include compliance metrics for the different features in the property characterization data. The training subsystem 262 processes the property characterization data 261 and the training labels 263 using the re-design engine 130 to generate a proposed re-design plan for a corresponding property, and determines an error between the proposed re-design plan and the training labels 263. The training subsystem 262 then updates the current parameters of the re-design engine 130 using the determined error, e.g., using backpropagation. Thus, by processing training examples characterizing the selected properties, the training system 250 can train the re-design engine 130 to generate re-design plans that improve the compliance metrics for real properties (e.g., in the form of real property characterization data 266 for a selected property) submitted to the re-design engine 130. Thus, the re-design engine 130 can be trained to propose modifications to the categories and sub-categories of a real property interest that result in an increase in the compliance metric associated with the sub-categories and categories.

Figure 3A:
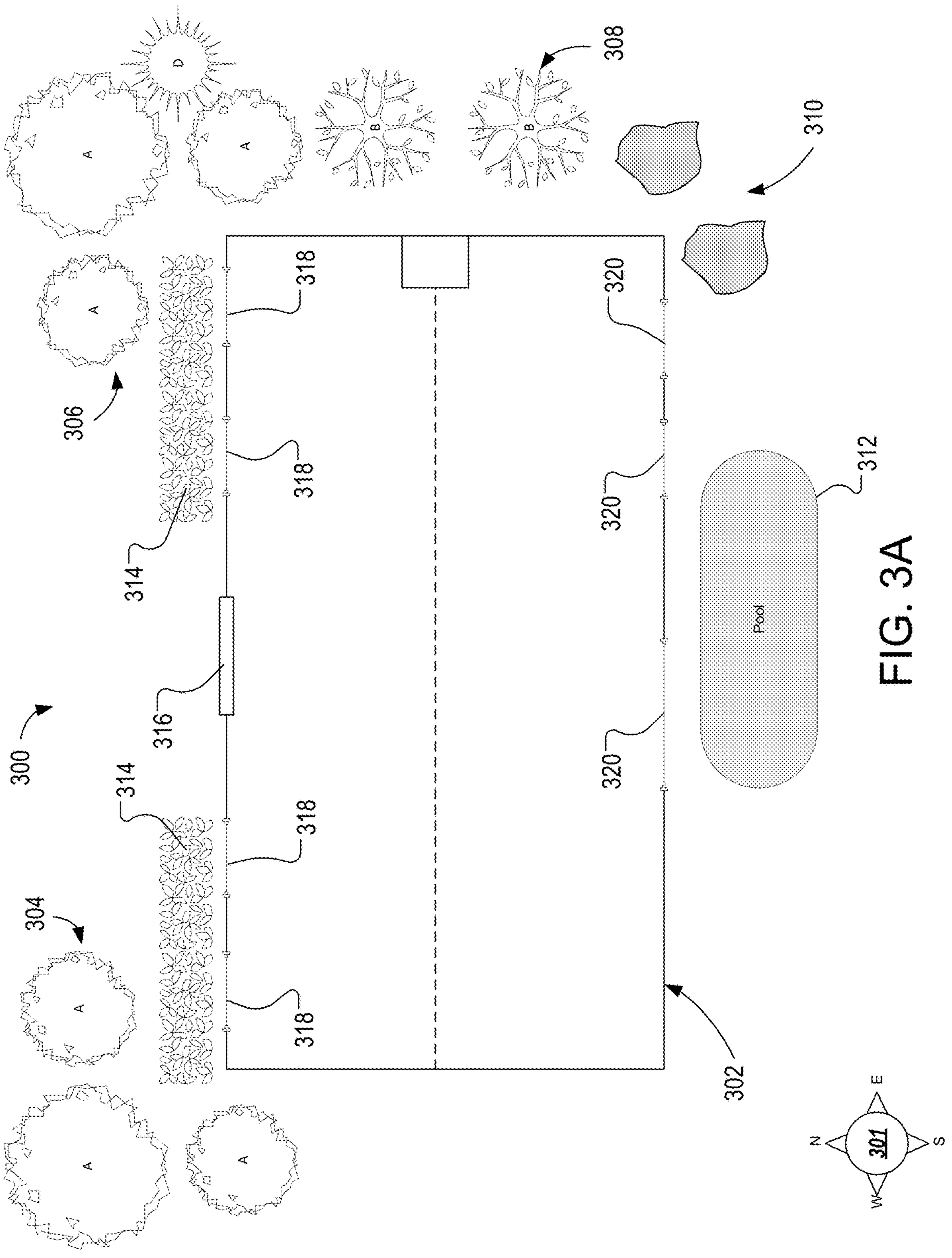
FIG. 3A depicts the exterior of a real property interest that includes a residential property.
Figure 3B:
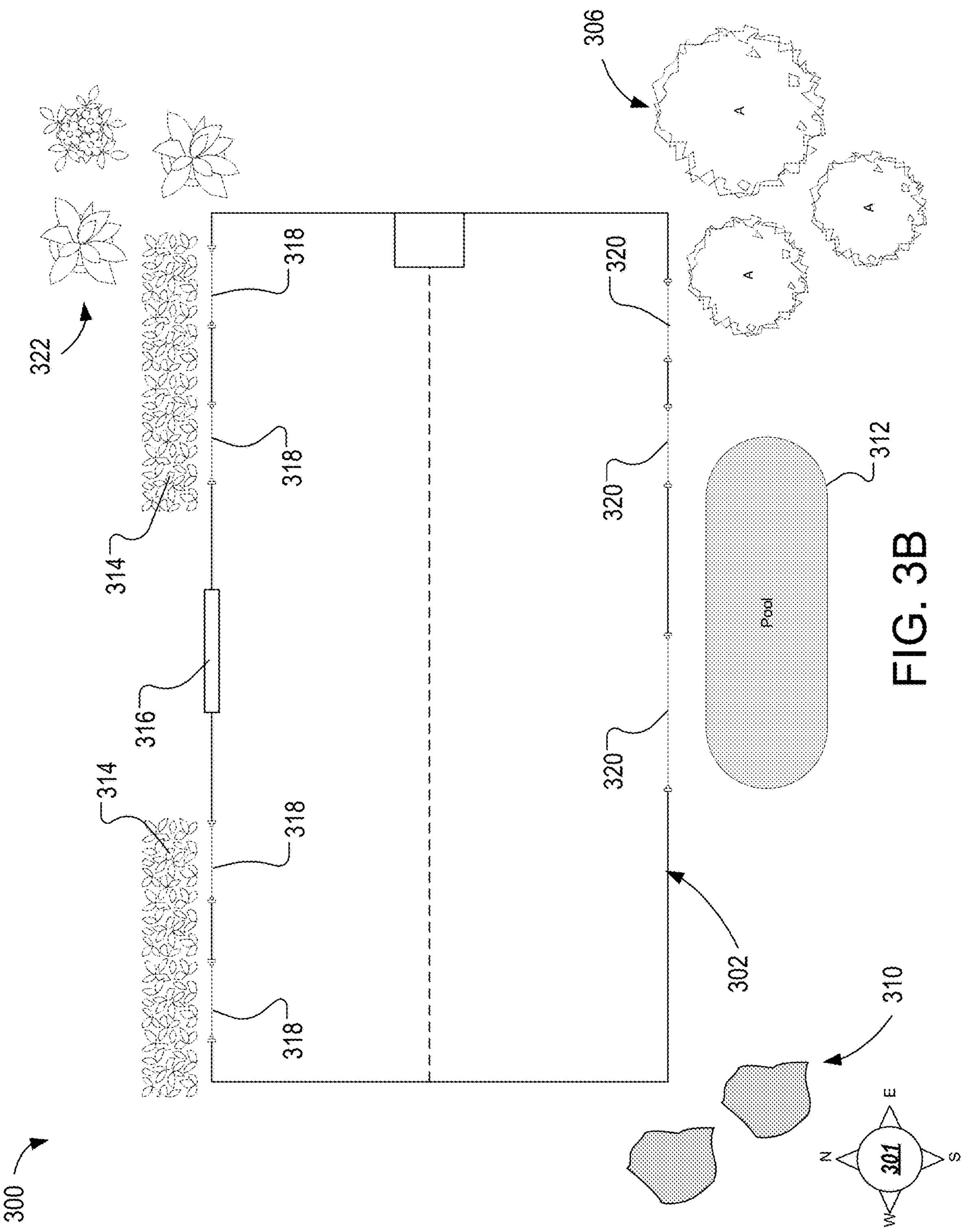
FIG. 3B is a schematic that illustrates an example of the real property interest shown in FIG. 3A, after having been modified by the system of the present disclosure.
Figure 4A:
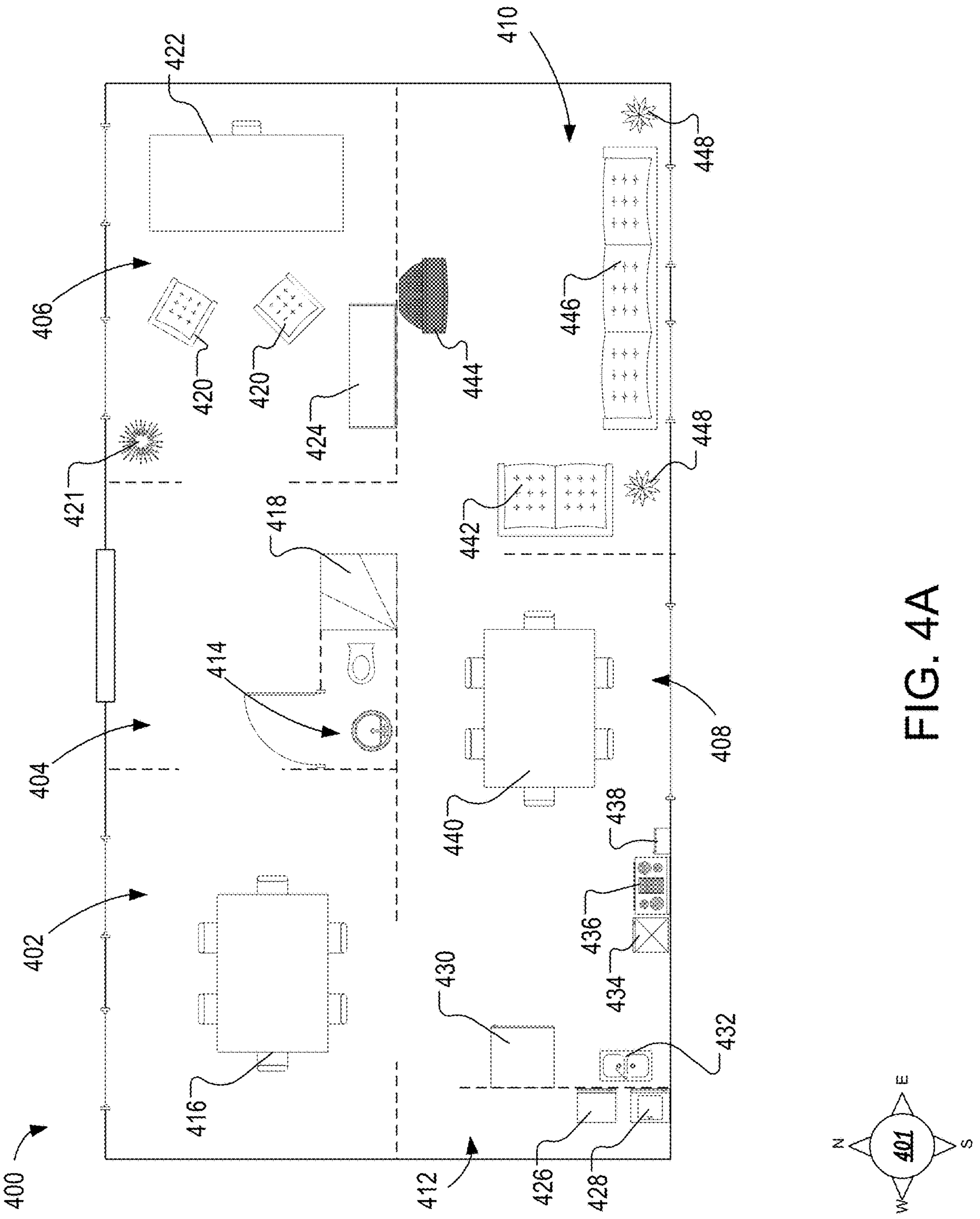
FIG. 4A depicts a first level interior of a real property interest.
Figure 4B:
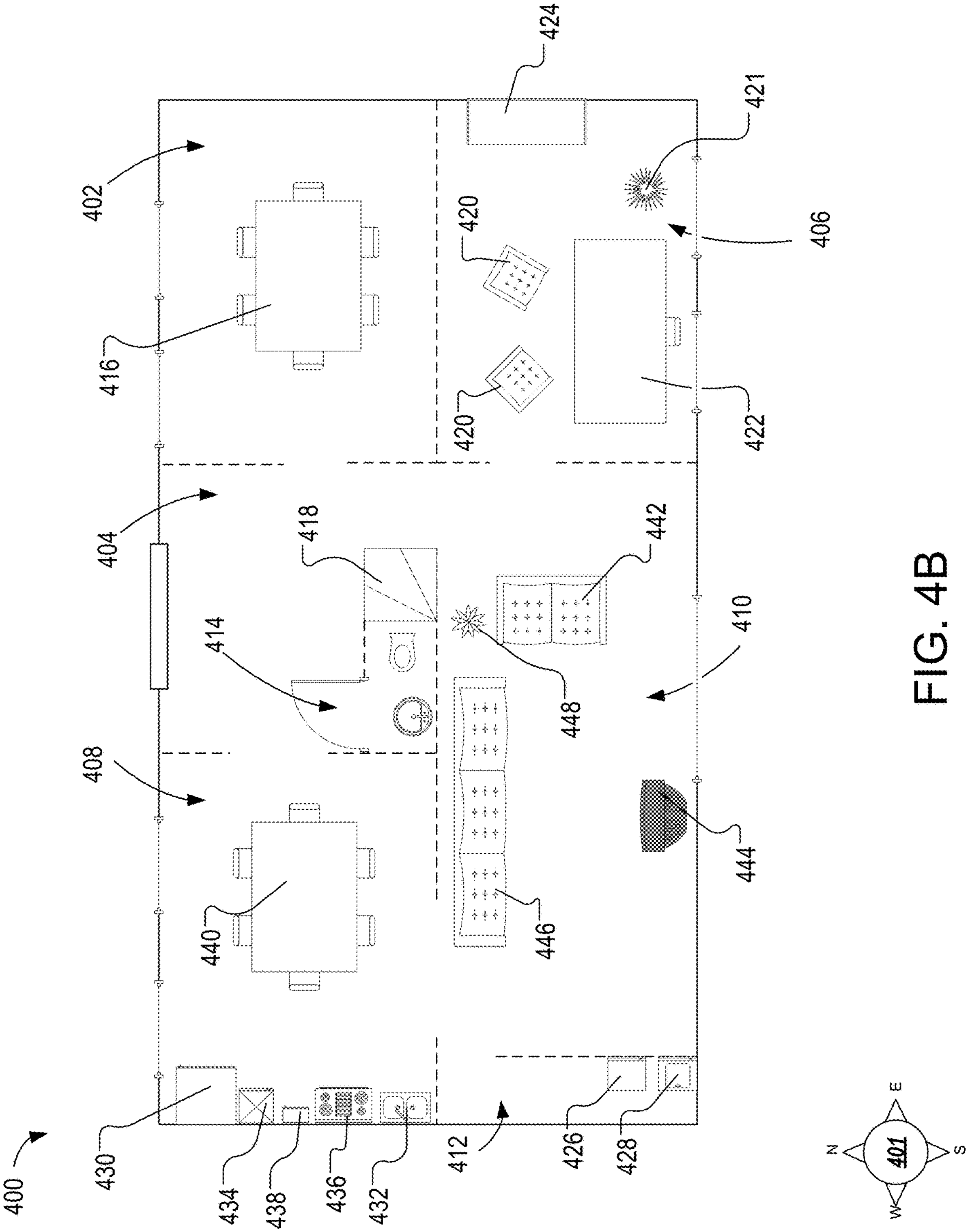
FIG. 4B is a schematic that illustrates an example of the real property interest shown in FIG. 4A, after having been modified by the system of the present disclosure.
Figure 5A:
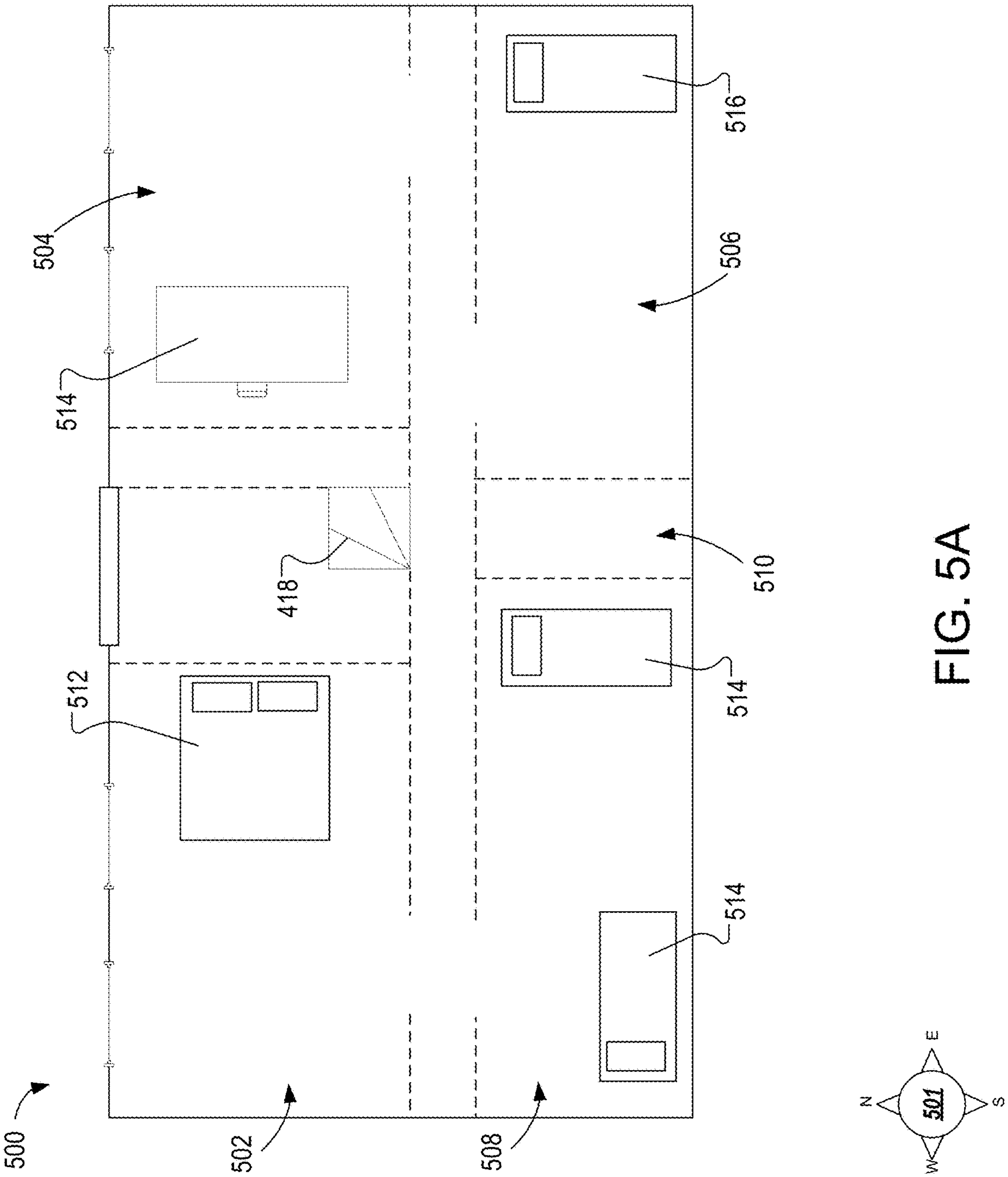
FIG. 5A depicts a second level interior of a real property interest.
Figure 5B:
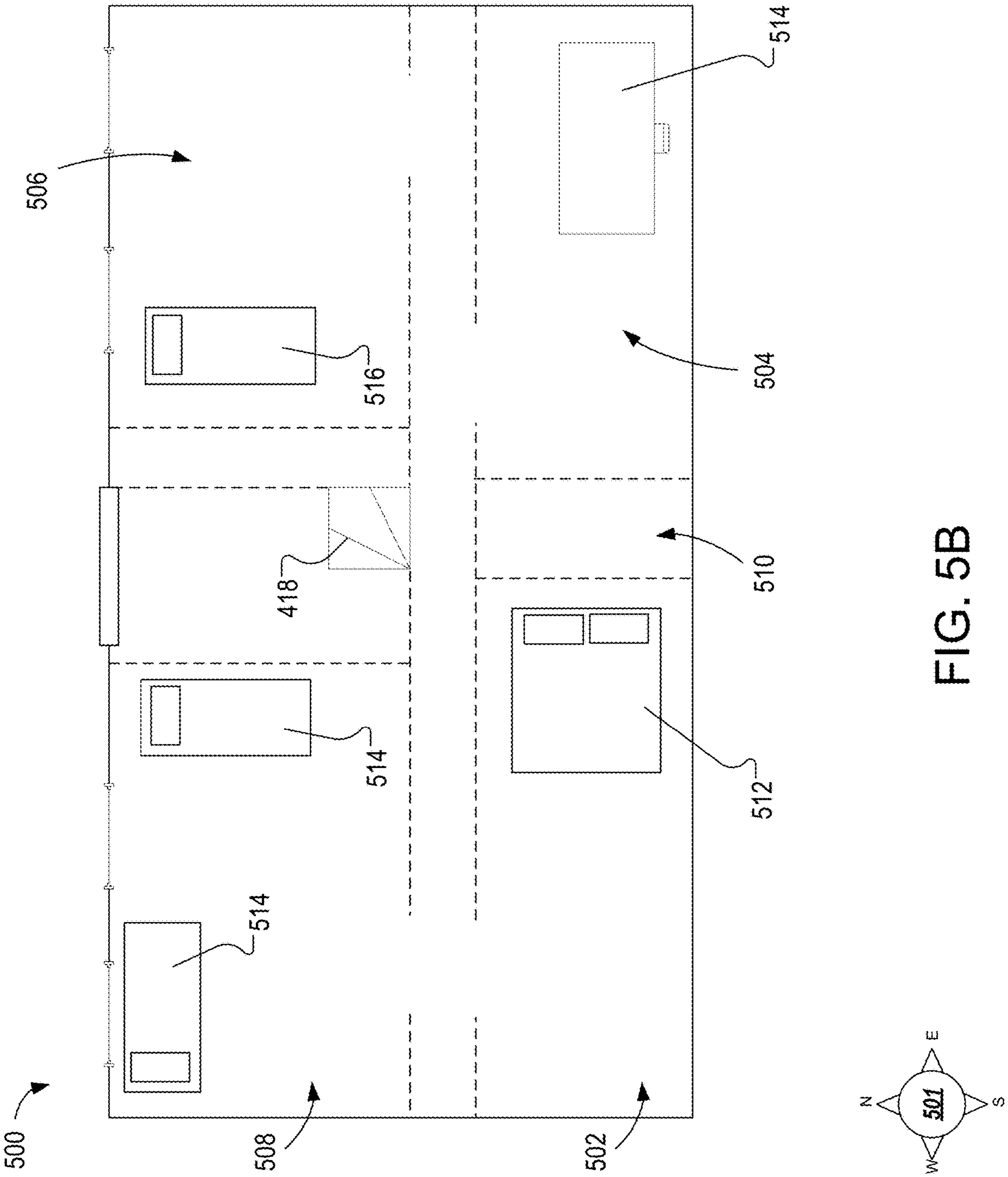
FIG. 5B is a schematic that illustrates an example of the real property interest shown in FIG. 5A, after having been modified by the system of the present disclosure.

FIGS. 3A, 4A, and 5A are schematics that illustrate examples of different aspects of a real property interest that are obtained by the system of the present disclosure (e.g., engine 110). FIGS. 3B, 4B, and 5B are schematics that illustrate examples of the different aspects of the real property interest shown in FIGS. 3A, 4A, and 5A, respectively, after having been modified by the system of the present disclosure (e.g., engine 130) in order to increase compliance with a design rule set.

The schematics in FIGS. 3A, 4A, and 5A illustrate, respectively, an exterior 300 of a real property interest, a first level interior 400 of the real property interest, and a second level interior 500 of the real property interest. As explained herein, the information depicted in the examples of FIGS. 3A, 4A, and 5A can be obtained by the system through a locally stored database or through a database stored by third party providers of real estate information. For example, the system can be configured to allow a user of the system to select an existing real estate property (e.g., through a drop down list or through querying a database). The system then loads the information about the exterior and/or interior of the real property interest into the system. Alternatively or in addition, the system can be configured to allow the user to enter information about the real property, such as by uploading image files, text files or other document files. The information obtained by the system, such as that shown in the schematics of FIGS. 3A, 4A, and 5A, does not have to be in the form of an image. Rather, the information can be stored as text information (e.g., a delimited text file) or other type of file. If the real property information is an image file, the system can apply image processing to the image to extract information about the real property, such as dimensions of the property features, orientation of the property relative to a fixed direction, arrangement of rooms in the property, and/or arrangement of items on the property, among others. Such extracted information can be stored locally on the system.

FIG. 3A depicts the exterior 300 of a real property interest that includes a residential property 302. FIG. 3A further includes an illustration of a compass 301 to provide a relative orientation of the residential property 302 and the objects arranged around the residential property. Although shown in FIG. 3A, the illustration of the compass 301 is not required to be depicted in the images obtained by the system. For instance, if relative position is required in order for the system to derive a compliance metric for one or more categories or one or more features, the relative position information can be linked to the categories/features in a data file. Accordingly, as shown in FIG. 3A, the real property interest includes a first grouping of trees 304 at a northwestern corner of the property, a second grouping of trees at a northeast corner of the property, and a third grouping of trees 308 at the east side of the property. The real property interest further includes bushes 314 placed at the north side of the property on either side of a front door 316. The real property interest further includes a boulder arrangement 310 at a south east corner of the property and a pool 312 at a southern facing side of the property. The residential property 302 further includes windows 318 at the north side of the property 302 and windows 320 at the south side of the property 302.

FIG. 4A depicts the first level interior 400 of the real property interest. A compass 401 provides a relative orientation of the residential property and the objects arranged around the first level. The first level interior 400 is divided into separate rooms: a dining room 402 at a northwest corner; a foyer or entryway 404 at a north facing side of the first level interior 400; an office 406 at a north east corner of the first level interior 400; a laundry room 412 at a southwest corner of the first level interior 400; a kitchen 408 at a south side of the residential property; a living/family room 410 at a southeast corner of the first level interior 400; and washroom 414 at a center of the first level interior 400. Stairs 418 to the second level are located adjacent the washroom 414. The dining room 402 includes a dining room table 416. The office 406 includes one or more plants 421 in a northwest corner, a desk 422 at an east side of the room 402, a bookcase 424 at a south side of the room 406, and chairs 420 arranged in front of the desk 422. The laundry room 412 includes a clothes washer 426 and dryer 428 at a southeast corner of the room 412. The kitchen 408 includes a refrigerator 430 and sink 432 at a west side of the room, a dishwasher 434, stove/oven 436 and microwave oven 438 at a south side of the room, and a kitchen table 440 at the east side of the room. The family/living room 410 includes plants 448 at both southwest and southeast corners, a couch 446 at a south side of the room 410, a second couch 442 at a west side of the room 410, and a television 444 at a north side of the room.

FIG. 5A depicts the second level interior 500 of the real property interest. A compass 501 provides a relative orientation of the residential property and the objects arranged around the second level. The second level interior 500 is divided into separate rooms: a master bedroom 502 arranged at a northwest corner of the second level 500, an office 504 arranged at a northeast corner of the second level 500, a guest bedroom 506 arranged at a south east corner of the second level, a bathroom 510 at a south facing side of the second level 500, and a bedroom 508 at a southwest corner of the second level 500. The master bedroom includes a bed 512 arranged at a east side of the room 502. The office 504 includes a desk 514 arranged at a west side of the room 504. The guest bedroom 506 includes a bed 516 arranged at an east side of the room 506. The bedroom 508 includes a first bed 514 arranged at a southwest corner of the room 508 and a second bed 514 arranged at an east side of the room 508.

As explained herein, the presently disclosed system can take the real property information depicted in FIGS. 3A, 4A, and 5A and obtain a compliance metric score based on how sufficiently the present arrangement of the property complies with a predefined design rule set. The predefined design rule set can be based on, e.g., Feng Shui or Vastu Shastra design principles.

Taking a predefined rule set based on Vastu Shastra as an example, the rule set can set forth whether objects and features are in an ideal or non-ideal location of a real property interest. For features/objects determined by the system to be in an ideal location as defined by the rule set, the system can increase a value of a compliance metric for the real property interest. For features/objects determined by the system to be in a non-ideal location as defined by the rule set, the system can decrease (or not increase) the compliance metric for the real property interest.

For instance, with respect to the exterior of a residential property, a pre-defined rule set based on Vastu Shastra may designate the ideal and non-ideal locations for various objects/features such as hills (e.g., land with a positive grade away from the residential property), land depression (e.g., land with a negative grade away from the residential property), trees, shrubbery, boulders, empty yard, firepits, pools, patios, decks, courts (e.g., basketball or tennis courts), walkways, among other features. In some examples, hills located on a west, southwest, or northwest region of a property can be designated in the design rule set as being a positive feature that increases a compliance metric. In some examples, hills located on an east, southeast, or northeast region of a property can be designated in the design rule set as being a negative feature that decreases a compliance metric.

In some examples, land depressions located on an east, southeast, or northeast region of a property can be designated in the design rule set as being a positive feature that increases a compliance metric. In some examples, land depressions located on a west, southwest, or northwest region of a property can be designated in the design rule set as being a negative feature that decreases a compliance metric.

In some examples, trees located on a northwest or northeast region of a property can be designated in the design rule set as being a negative feature that decreases a compliance metric. In some examples, trees located on a north, southeast, or southwest region of a property can be designated in the design rule set as being a positive feature that increases a compliance metric.

In some examples, pools located on a north, northeast or south region of a property can be designated in the design rule set as being a positive feature that increases a compliance metric. In some examples, pools located on a northwest, southwest or southeast region of a property can be designated in the design rule set as being a negative feature that decreases a compliance metric.

In some examples, rock boulders located on a southwest, northwest, west, or south region of a property can be designated in the design rule set as being a positive feature that increases a compliance metric. In some examples, rock boulders located on a southeast, northeast, north, or east region of a property can be designated in the design rule set as being a negative feature that decreases a compliance metric.

In some examples, a living room located on a west or southwest region of a property can be designated in the design rule set as being a positive feature that increases a compliance metric. In some examples, a living room located on an east or southeast region of a property can be designated in the design rule set as being a negative feature that decreases a compliance metric.

In some examples, a dining table located on a west region of a property or room can be designated in the design rule set as being a negative feature that decreases a compliance metric. In some examples, a dining table located on an east region of a property or room can be designated in the design rule set as being a positive feature that increases a compliance metric.

In some examples, a stove/oven located on a west or southwest region of a property or room can be designated in the design rule set as being a negative feature that decreases a compliance metric. In some examples, a stove/oven located on an northwest region of a property or room can be designated in the design rule set as being a negative feature that decreases a compliance metric.

In some examples, a door located on a northwest region of a property or room can be designated in the design rule set as being a negative feature that decreases a compliance metric. In some examples, a door located on a southeast region of a property or room can be designated in the design rule set as being a positive feature that increases a compliance metric.

A design rule set can designate additional or different features and objects, other than those mentioned here, as being positive or negative features that increase or decrease a compliance metric, respectively.

Using the foregoing examples and other design rules, the presently disclosed system can derive, e.g., a compliance metric for each room of the real property interest depicted in FIGS. 4A and 5A. Further, the system can derive a compliance metric for the exterior 300 of the real property interest. Further, the system can derive a compliance metric for each of the first level interior 400 and the second level interior 500 of the real property interest. For instance, the system could take an average of the compliance metric for each room on the first level to provide the first level interior compliance metric, and could take an average of the compliance metric for each room on the second level to provide the second level interior compliance metric. In some implementations, the different rooms can be weighted differently in deriving the average. For example, the location of the kitchen and family room may have more importance to compliance than the office or dining room. Accordingly, the compliance metric values for the kitchen and family room can be weighted greater than the office and dining room. In some examples, an overall compliance metric can be obtained for the entire real property interest based on the derived compliance metrics of the exterior 300, the first level interior 400, and the second level interior 500, or any combination thereof. Again, the overall compliance metric can be an average, such as a weighted average.

In some implementations, the overall compliance metric and/or the sub-category compliance metrics for the different levels and rooms of the real property interest can be output (210) by the system (e.g., to a display) for user review and/or stored in a database.

In some implementations, the presently disclosed system can further modify the real property information based on the predefined rule set to generate a re-design plan of the real property interest that exhibits improved compliance with the design rule set.

In some examples, the re-design plan can include image files that depict the proposed re-design of the real property interest. Alternatively, or in addition, the re-design plan can include text files or other documents that set forth how to modify the real property interest.

FIGS. 3B, 4B, and 5B are schematics that illustrate examples of the real property interest shown in FIGS. 3A, 4A, and 5A, respectively, after having been modified by the system of the present disclosure (e.g., engine 130) in order to increase compliance with a design rule set.

For instance, in FIG. 3B, trees 304 at the northwest corner of the real property have been removed, and the trees 306 at the northeast corner have been moved to the southeast corner to improve a compliance metric. Furthermore, new plants 322 have been added to the northeast corner to improve the compliance metric, whereas rock boulders 310 have been moved from the southeast corner to the southwest corner to improve the compliance metric. Both shrubbery 314 and pool 312 have been left in their present locations. This can be because the system determines that there is no increase in compliance metric value by re-arranging those features, and/or because the system associates an additional negative weight to modifying those features that would result in a lower compliance metric value if they were moved. An additional positive or negative weight may be applied by the system to incorporate the complexity and/or cost of modifying a feature of the real property interest.

In the example of FIG. 4B, the proposed re-design plan includes moving the dining room 402 from the northwest corner to the northeast corner. The proposed re-design plan further includes moving the living/family room 410 from the southeast corner to the southwest/south side of the first interior floor 400. Furthermore, the television is relocated to the south wall instead of the north wall of the room 410, the couch 446 is relocated to the north wall instead of the south wall of the room 410, the couch 442 is relocated from the west side to the east side of room 410, and one plant 448 is removed from room 410. Moreover, the size of room 410 is enlarged by pushing a wall further east. The proposed re-design plan further includes moving the kitchen 408 from the south side to the northwest side of the real property, and further moving the refrigerator 430, the dishwasher 434, the microwave oven 438, and the stove/oven 436 to the west wall of the kitchen 408. The proposed re-design plan further includes moving the office 406 from the northeast corner to the southeast corner of the property, and arranging the desk 422 at the south wall of room 406 and arranging the book case 424 at the east wall of room 406.

In the example of FIG. 5B, the proposed re-design plan includes moving the master bedroom 502 from the north-west corner of the second interior level 500 to the southwest corner of the second interior level 500, and further leaving the bed 512 against the east wall of the room 502. The proposed re-design plan further includes moving the office 504 from the northeast corner to the southeast corner and re-arranging the desk 514 against the south wall. The proposed re-design plan further includes moving the guest bedroom from the southeast corner to the northeast corner, and placing the bed 516 against the west wall. The proposed re-design plan further includes moving the bedroom 508 from the southwest corner to the northwest corner and arranging the beds 514 against the north and east walls of the room 508.

The proposed re-design plans, such as those depicted in FIGS. 3B, 4B, and 5B can be output (210) by the system (e.g., to a display) for review by the user along with the newly derived compliance metric associated with each room, level or entire property, or combinations thereof.

Figure 6:
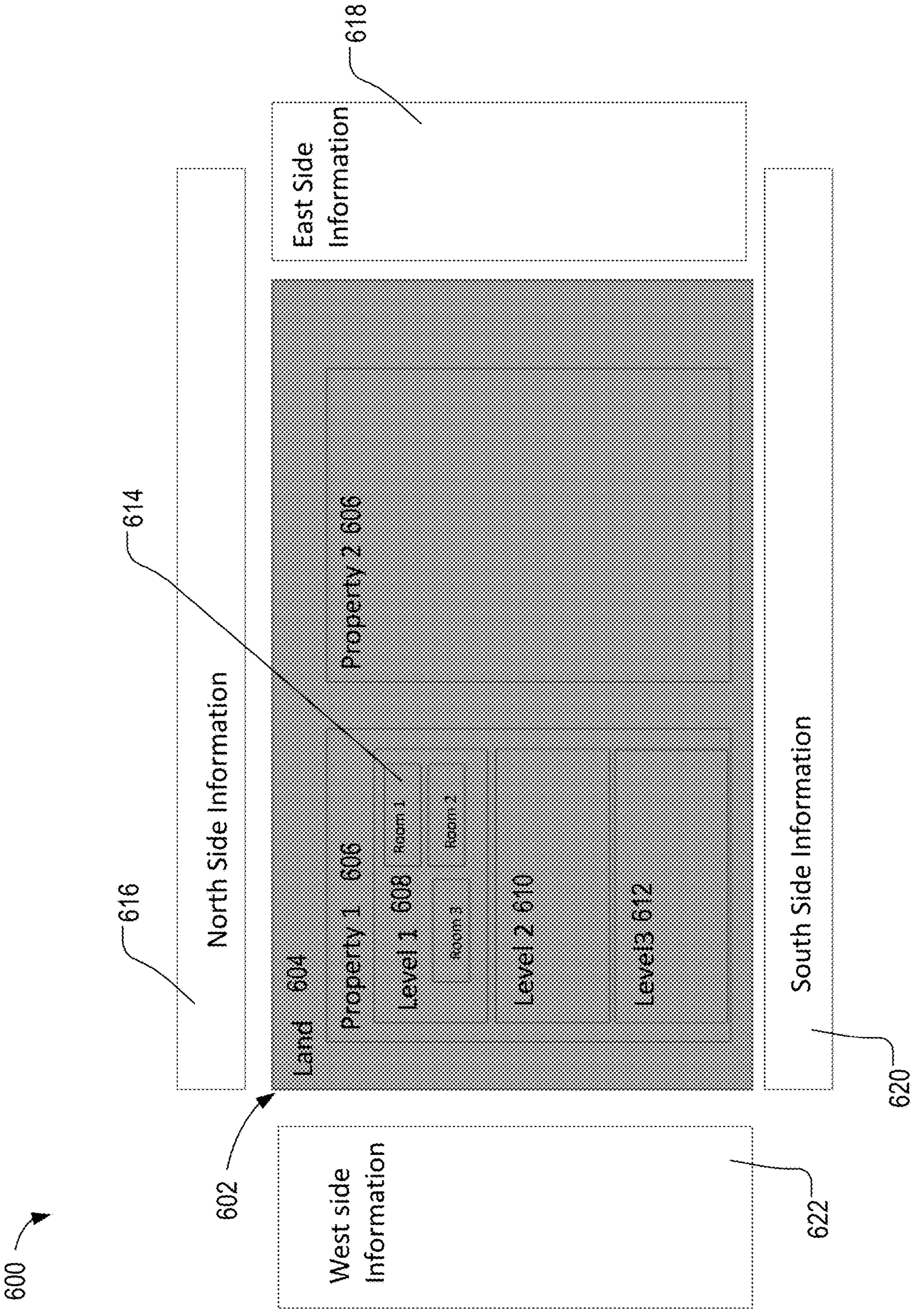
FIG. 6 is a schematic that illustrates an example layout of how the system can output real property information to a user on a display.

FIG. 6 is a schematic that illustrates an example layout 600 of how the system can output real property information to a user on a display. The layout 600 can be presented to the user as output from the system after an analysis has been conducted on the real property interest. For instance, the layout 600 can be presented along with the compliance metric following the architectural design compliance engine's analysis of the real property interest. Alternatively, or in addition, the layout 600 can be presented as following the architectural re-design engine's modification of the real property interest. In such case, the layout 600 can be accompanied by the updated compliance metric for the modified property. In some implementations, the layout 600 can be presented as a data entry screen for a user to enter information about the real property interest before the architectural design compliance engine or the architectural re-design engine performs their analyses.

The layout 600 can include a central portion 602 that depicts one or more views of the real property interest. For instance, in the example case of a residential property as the real property interest, the central portion 602 can include a land view 604 of the exterior of the residential property, a first and/or second property view 606, a first level view 608, a second level view 610, a third level view 612, and room views 614 among other views. The land view 604 can include, e.g., an image of one or more residential properties from the outside, such as a satellite view or a street level view. The land view 604 can include details of features surrounding the properties such as roads, streams, trees, and other structures in the vicinity of the properties. The property level view 606 can also include an image from the outside of a property, but would be restricted to a single real property interest. For instance, the property level view 606 can include a satellite image or street-level image of a single residential property. Each of the first level view 608, second level view 610, and third level view 612 can include images of the interior of the real property interest. For instance, each level view can include a schematic depicting the layout of different rooms on the selected level. Though three different levels are depicted in FIG. 6, more or fewer levels can be included depending on the number of levels available in the real property interest. The room views 614 can include images of rooms within a particular level, such as images of a kitchen, living room, office, bedroom, washroom, or other room within the real property interest. In some implementations, the layout may make the different level views selectable depending on which view a user is interested in analyzing.

Layout also may include outer portions 616, 618, 620, and 622. Outer portions 616, 618, 620, and 622 include information about the selected level view in the central portion 602 of the layout 600. For instance, the outer portions 616, 618, 620, and 622 can include information about location of objects, such as trees, plants, pools, walkways, tables, couches, beds, bookshelves, chairs, stoves, doorways, windows, among other features. The outer portions 616, 618, 620, and 622 can be arranged in different regions relative to a fixed location or point. For instance, the outer portions 616, 618, 620, and 622 could be arranged as north 616, east 618, south 622, and west 624 and include information about the selected level associated with those directions. For example, if the central portion 602 displays a selected room level, the north outer portion 616 can include information about objects or features on the north side of the room. Similarly, the east, west and south portions can include information about objects or features on the east, west and south sides of the selected room level. Although only east, west, north and south are shown in FIG. 6, in some cases, additional outer portions can be provided for regions in between those, such as a northwest outer portion, a northeast outer portion, a southeast outer portion and a southwest outer portion. The information contained in the outer portions can include text entry boxes into which a user can enter information about the selected level. Alternatively, or in addition, the information contained in the outer portions can include text boxes that provide information about the selected level as determined by the architectural design compliance engine or the architectural re-design engine.

Figure 7:
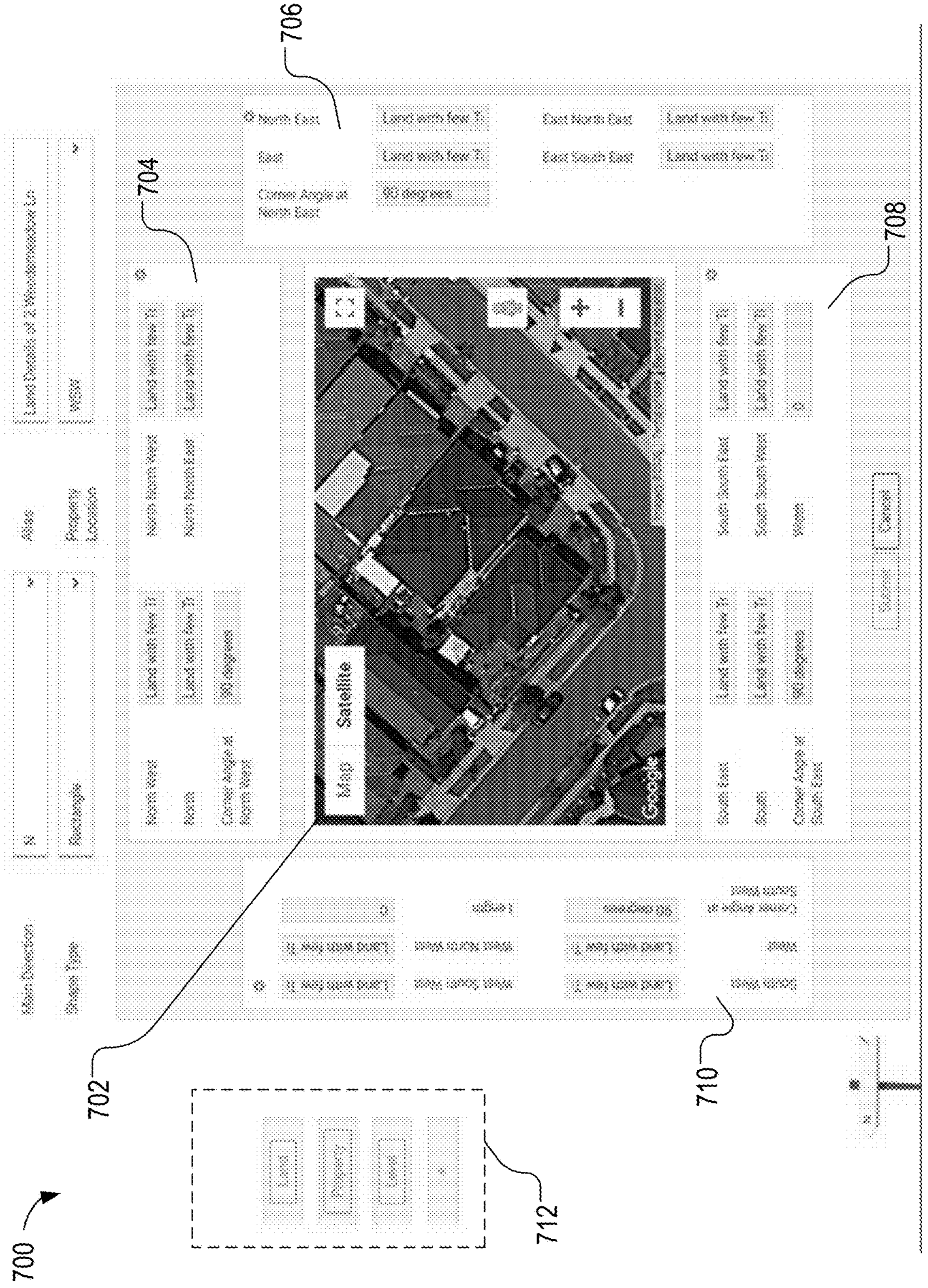
FIG. 7 is a screen shot of an example layout output to a display by the system described herein.

FIG. 7 is a screen shot of an example layout output to a display by the system described herein. As shown in FIG. 7, the screen shot includes a level selection option 712 with which a user can select the particular view level to be displayed in the central portion 702 of the screen. In this particular example a land level view has been selected such that a satellite image view of a real property interest, including surrounding properties, is shown in the central portion 702. The central portion 702 is surrounded by outer portions 704, 706, 708 and 710 that include information about different regions of the property shown in the selected level view. For instance, the north outer portion 704 includes information about what features (e.g., land with trees) are included on the north side, the north west side, the north north west side, and the north north east side of the property. The north outer portion 704 also includes a field that details the style of corner angle (90 degrees) at the north west side of the property.

Figure 8:
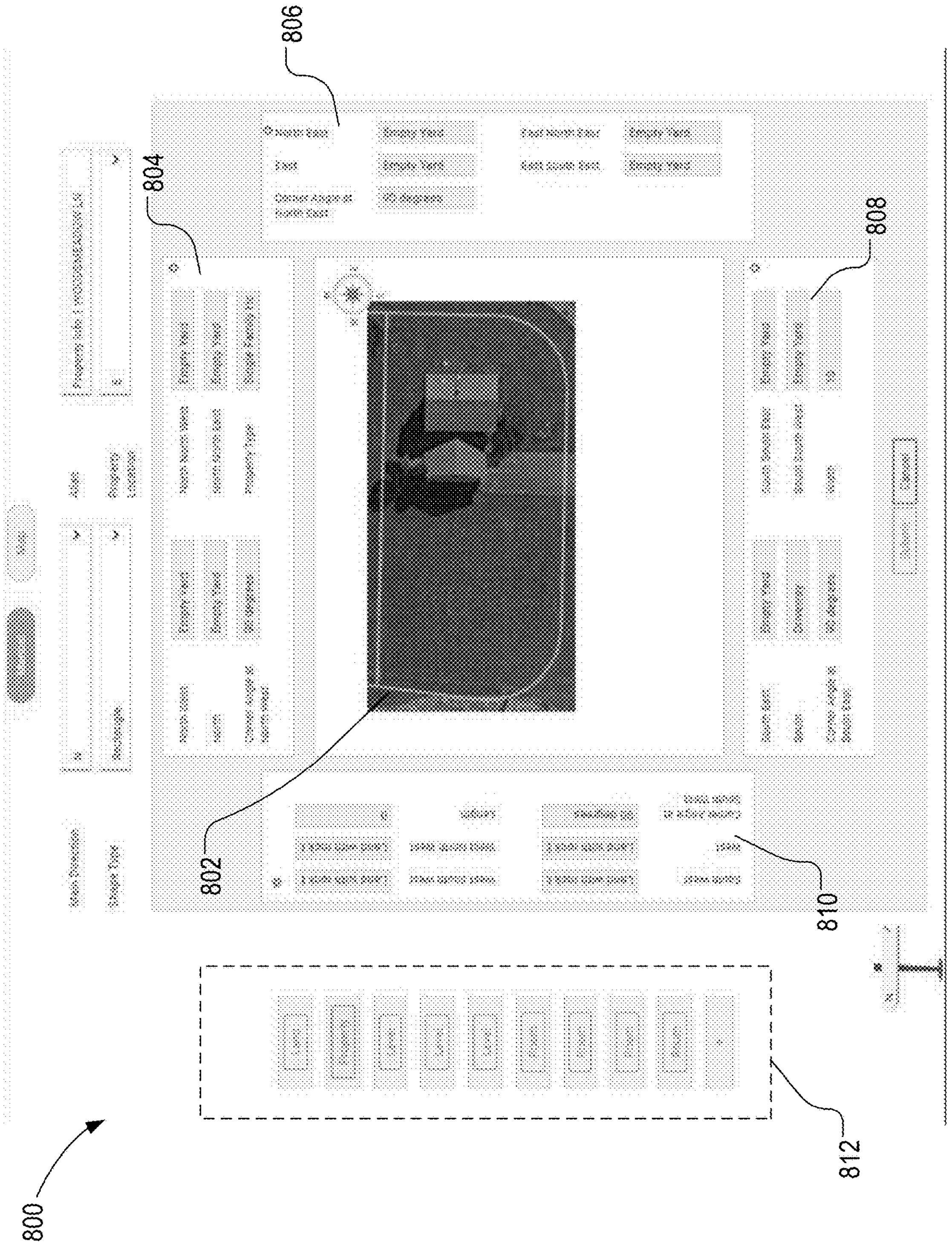
FIG. 8 is a screen shot of an example layout output to a display by the system described herein.

FIG. 8 is a screen shot of another example layout output to a display by the system described herein. As shown in FIG. 8, and similar to FIG. 7, the screen shot includes a level selection option 812 with which a user can select the particular view level to be displayed in the central portion 802 of the screen. In this particular example a property level view has been selected such that a satellite image view of a single real property interest, excluding surrounding properties, is shown in the central portion 802. The central portion 802 is surrounded by outer portions 804, 806, 808 and 810 that include information about different regions of the property shown in the selected level view. For instance, the north outer portion 804 includes information about what features (e.g., empty yard) are included on the north side, the north west side, the north north west side, and the north north east side of the property. The north outer portion 704 also includes a field that details the style of corner angle (90 degrees) at the north west side of the property.

Figure 9:
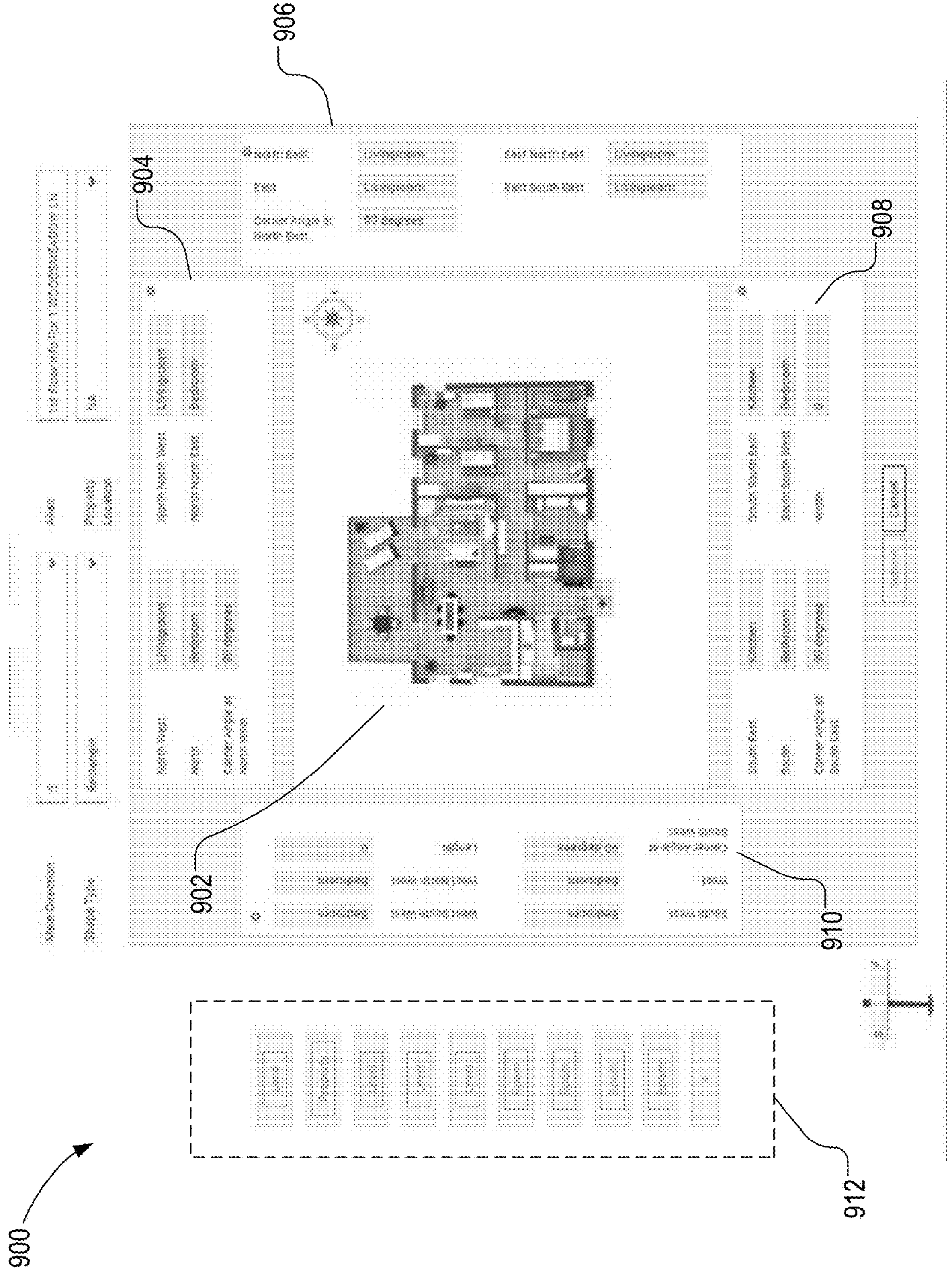
FIG. 9 is a screen shot of an example layout output to a display by the system described herein.

FIG. 9 is a screen shot of another example layout output to a display by the system described herein. As shown in FIG. 9, the screen shot includes a level selection option 912 with which a user can select the particular view level to be displayed in the central portion 902 of the screen. In this particular example a first level interior view has been selected such that a schematic drawing of a first floor, including all rooms of the first floor, is shown in the central portion 902. The central portion 902 is surrounded by outer portions 904, 906, 908 and 910 that include information about different regions of the property shown in the selected level view. For instance, the north outer portion 904 includes information about what rooms (e.g., living room and bedroom) are located on the north side, the north west side, the north north west side, and the north north east side of the property.

This specification uses the term "configured" in connection with systems and computer program components. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a data communication network.

In this specification, the term "database" is used broadly to refer to any collection of data: the data does not need to be structured in any particular way, or structured at all, and it can be stored on storage devices in one or more locations.

Thus, for example, the index database can include multiple collections of data, each of which may be organized and accessed differently.

Similarly, in this specification the term "engine" is used broadly to refer to a software-based system, subsystem, or process that is programmed to perform one or more specific functions. Generally, an engine will be implemented as one or more software modules or components, installed on one or more computers in one or more locations. In some cases, one or more computers will be dedicated to a particular engine; in other cases, multiple engines can be installed and running on the same computer or computers.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone that is running a messaging application, and receiving responsive messages from the user in return.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TensorFlow framework, a Microsoft Cognitive Toolkit framework, an Apache Singa framework, or an Apache MXNet framework.

Embodiments of the subject matter described in this specification can be implemented in a computing system that includes a back end component, e.g., as a data server, or that includes a middleware component, e.g., an application server, or that includes a front end component, e.g., a client computer having a graphical user interface, a web browser, or an app through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

Accordingly, other implementations are within the scope of the following claims.

What is claimed is:

1. A computer-implemented method comprising:

obtaining, by a first computing device, property characterization data for a first real property interest, the property characterization data including location characterization data characterizing an orientation of the first real property interest relative to a fixed location point and structural data identifying locations of load-bearing structures within the first real property interest;

applying the property characterization data to an architectural design compliance engine of the first computing device, wherein the architectural design compliance engine uses machine learning models specifically trained on building structural data, to obtain a first metric indicative of compliance of the first real property interest to an architectural design rule set, wherein applying the property characterization data to an architectural design compliance engine to obtain the first metric comprises parsing the property characterization data into a plurality of property categories, for each category of the plurality of categories, deriving a respective category rating by evaluating the category against a corresponding rule in the architectural design rule set to provide a plurality of category ratings, and deriving the first metric based on the plurality of category ratings;

generating, by the first computing device, a proposed re-design plan for the first real property interest associated with a second metric, wherein the second metric is indicative of greater compliance with the architectural design rule set than the first metric, wherein generating, by the architectural design compliance engine, the proposed re-design plan for the first real property interest comprises modifying a layout of the first real property interest in accordance with the architectural design rule set, wherein modifying the layout of the first real property interest comprises applying the property characterization data to a neural network to obtain the proposed re-design plan, wherein the neural network is trained on existing real property layouts pre-associated with metrics indicative of high compliance with the architectural design rule set to modify property design plans to have improved compliance with the architectural rule set, and wherein modifying the layout comprises executing a check of the proposed re-design plan against the structural data to exclude modifications that cause a load-bearing structure to be removed or located in a non-preferred position; and modifying the real property interest in accordance with the proposed re-design plan, wherein the architectural design rule set is based on Vastu Shastra design principles or Feng Shui design principles.

2. The computer-implemented method of claim 1, wherein the property characterization data comprises location characterization data that characterizes a location of the first real property interest.

3. The computer-implemented method of claim 2, wherein the location characterization data comprises orientation data characterizing an orientation of the first real property interest relative to a fixed location point.

4. The computer-implemented method of claim 1, wherein the property characterization data comprises neighborhood characterization data characterizing landscape features of an area in which the first real property interest is located.

5. The computer-implemented method of claim 4, wherein the neighborhood characterization data comprises one or more of flora data characterizing arrangement of flora in a vicinity of the first real property interest, street data characterizing an arrangement of one or more streets in the vicinity of the first real property interest, and structural element data characterizing an arrangement of one or more building structures in the vicinity of the first real property interest.

6. The computer-implemented method of claim 1, wherein the property characterization data comprises one or more images of the first real property.

7. The computer-implemented method of claim 1, wherein parsing the property characterization data comprises applying the property characterization data to a neural network to obtain the plurality of property categories.

8. The computer-implemented method of claim 1, wherein parsing the property characterization data comprises deriving an orientation of one or more features of the first real property.

9. The computer-implemented method of claim 1, wherein modifying the layout of the first real property interest in accordance with the architectural design rule set comprises changing a design size of a room of the first real property interest to increase a compliancy rating of the room with a corresponding rule in the architectural design rule set.

10. The computer-implemented method of claim 1, wherein modifying the layout of the first real property interest in accordance with the architectural design rule set comprises changing a design orientation of a room of the first real property interest to increase a compliancy rating of the room with a corresponding rule in the architectural design rule set.

11. The computer-implemented method of claim 1, wherein modifying the layout of the first real property interest in accordance with the architectural design rule set comprises changing a design location of a room of the first real property interest to increase a compliancy rating of the room with a corresponding rule in the architectural design rule set.

12. The computer-implemented method of claim 1, wherein modifying the layout of the first real property interest in accordance with the architectural design rule set comprises modifying a flora arrangement design of the first real property interest to increase a compliancy rating of the first real property with the architectural design rule set.

13. The computer-implemented method of claim 1, wherein generating, by the architectural design compliance engine, the proposed re-design plan for the first real property interest comprises constructing a three-dimensional image of the proposed re-design plan.

14. The computer-implemented method of claim 1, wherein generating, by the architectural design compliance engine, the proposed re-design plan for the first real property interest comprises:

applying a first weighting to a first compliancy rating associated with the proposed re-design plan to provide a first weighted compliancy rating;

applying a second weighting to a second compliancy rating associated with the proposed re-design plan to provide a second weighted compliancy rating, wherein the second weighting is different from the first weighting, and wherein the first weighting and the second weighting are defined in accordance with the architectural design rule set; and deriving the second metric based on the first compliancy rating and the second compliancy rating.

15. A system comprising one or more computers and one or more storage devices on which are stored instructions that are operable, when executed by the one or more computers, to cause the one or more computers to perform operations comprising:

obtaining, by at least a first computing device, property characterization data for a first real property interest, the property characterization data including location characterization data characterizing an orientation of the first real property interest relative to a fixed location point and structural data identifying locations of load-bearing structures within the first real property interest;

applying the property characterization data to an architectural design compliance engine, wherein the architectural design compliance engine uses machine learning models specifically trained on building structural data, to obtain a first metric indicative of compliance of the first real property interest to an architectural design rule set, wherein applying the property characterization data to an architectural design compliance engine to obtain the first metric comprises parsing the property characterization data into a plurality of property categories, for each category of the plurality of categories, deriving a respective category rating by evaluating the category against a corresponding rule in the architectural design rule set to provide a plurality of category ratings, and deriving the first metric based on the plurality of category ratings; and generating, by the architectural design compliance engine, a proposed re-design plan for the first real property interest associated with a second metric, wherein the second metric is indicative of greater compliance with the architectural design rule set than the first metric, wherein generating, by the architectural design compliance engine, the proposed re-design plan for the first real property interest comprises modifying a layout of the first real property interest in accordance with the architectural design rule set, wherein modifying the layout of the first real property interest comprises applying the property characterization data to a neural network to obtain the proposed re-design plan, wherein the neural network is trained on existing real property layouts pre-associated with metrics indicative of high compliance with the architectural design rule set to modify property design plans to have improved compliance with the architectural rule set, and wherein modifying the layout comprises executing a check of the proposed re-design plan against the structural data to exclude modifications that cause a load-bearing structure to be removed or located in a non-preferred position; and modifying the real property interest in accordance with the proposed re-design plan, wherein the architectural design rule set is based on Vastu Shastra design principles or Feng Shui design principles.

16. One or more non-transitory computer storage media encoded with computer program instructions that when executed by one or more computers cause the one or more computers to perform operations comprising:

obtaining, by at least a first computing device, property characterization data for a first real property interest, the property characterization data including location characterization data characterizing an orientation of the first real property interest relative to a fixed location point and structural data identifying locations of load-bearing structures within the first real property interest;

applying the property characterization data to an architectural design compliance engine, wherein the architectural design compliance engine uses machine learning models specifically trained on building structural data, to obtain a first metric indicative of compliance of the first real property interest to an architectural design rule set, wherein applying the property characterization data to an architectural design compliance engine to obtain the first metric comprises parsing the property characterization data into a plurality of property categories, for each category of the plurality of categories, deriving a respective category rating by evaluating the category against a corresponding rule in the architectural design rule set to provide a plurality of category ratings, and deriving the first metric based on the plurality of category ratings;

generating, by the architectural design compliance engine, a proposed re-design plan for the first real property interest associated with a second metric, wherein the second metric is indicative of greater compliance with the architectural design rule set than the first metric, wherein generating, by the architectural design compliance engine, the proposed re-design plan for the first real property interest comprises modifying a layout of the first real property interest in accordance with the architectural design rule set, wherein modifying the layout of the first real property interest comprises applying the property characterization data to a neural network to obtain the proposed re-design plan, wherein the neural network is trained to modify property design plans to have improved compliance with the architectural rule set on existing real property layouts pre-associated with metrics indicative of high compliance with the architectural design rule set, and wherein modifying the layout comprises executing a check of the proposed re-design plan against the structural data to exclude modifications that cause a load-bearing structure to be removed or located in a non-preferred position; and modifying the real property interest in accordance with the proposed re-design plan, wherein the architectural design rule set is based on Vastu Shastra design principles or Feng Shui design principles.

* * * * *